(12) United States Patent
John et al.

(10) Patent No.: US 10,742,206 B2
(45) Date of Patent: Aug. 11, 2020

(54) SWITCHING CIRCUIT

(71) Applicants: Dialog Semiconductor (UK) Limited, London (GB); Silego Technology Inc., Santa Clara, CA (US)

(72) Inventors: Nathan John, Prescott, AZ (US); John McDonald, Sunnyvale, CA (US); Horst Knoedgen, Munich (DE); Ambreesh Bhattad, Swindon (GB)

(73) Assignees: Dialog Semiconductor (UK) Limited, London (GB); Silego Technology Inc., Santa Clara, CA (US)

( * ) Notice: Subject to any disclaimer, the term of this patent is extended or adjusted under 35 U.S.C. 154(b) by 0 days.

(21) Appl. No.: 16/198,234

(22) Filed: Nov. 21, 2018

(65) Prior Publication Data
US 2020/0162071 A1 May 21, 2020

(51) Int. Cl.
*H03H 11/24* (2006.01)
*H03K 17/14* (2006.01)
*G01K 1/14* (2006.01)
*G01R 31/327* (2006.01)

(52) U.S. Cl.
CPC ............ *H03K 17/145* (2013.01); *G01K 1/14* (2013.01); *G01R 31/3277* (2013.01); *H03H 11/245* (2013.01)

(58) Field of Classification Search
CPC .... H03K 17/145; G01K 1/14; G01R 32/3277; H03H 11/245
See application file for complete search history.

(56) References Cited

U.S. PATENT DOCUMENTS

| 4,260,911 | A | | 4/1981 | Brown, Jr. et al. |
| 4,492,296 | A | * | 1/1985 | Dubey ..................... G07D 5/08 |
| | | | | 194/318 |
| 5,990,665 | A | * | 11/1999 | Kawata ................. H02J 7/0068 |
| | | | | 320/162 |
| 6,479,975 | B1 | | 11/2002 | Plankensteiner et al. |
| 7,595,656 | B2 | * | 9/2009 | Hayami ............. H03K 19/0005 |
| | | | | 326/26 |

(Continued)

FOREIGN PATENT DOCUMENTS

| EP | 1 608 053 | 12/2005 |
| EP | 1 298 801 | 8/2006 |
| WO | WO 2014/146968 | 9/2014 |

*Primary Examiner* — Dinh T Le
(74) *Attorney, Agent, or Firm* — Saile Ackerman LLC; Stephen B. Ackerman

(57) ABSTRACT

A switching circuit and a method for providing a switch array having an on resistance is presented. The switch array has a plurality of switches, where each switch is arranged to be in different configuration states. The states include an enabled configuration and a disabled configuration. The switching states include an on state and an off state. Each switch is held in the off state when in the disabled configuration. Control circuitry sets the switches to either the enabled configuration or the disabled configuration, and a memory element coupled to the control circuitry and arranged to store configuration data for setting the configuration state of each of the switches. The control circuitry sets the configuration state of the switches based on a signal received from the memory element. The on resistance of the switch array depends on the switching state of the switches and their individual on resistances.

28 Claims, 18 Drawing Sheets

(56) References Cited

U.S. PATENT DOCUMENTS

| | | | |
|---|---|---|---|
| 7,609,043 B2 | 10/2009 | Sutardja et al. | |
| 7,801,193 B2* | 9/2010 | Yen | H01S 5/0683 |
| | | | 372/38.01 |
| 9,372,210 B1 | 6/2016 | McDonald et al. | |
| 2012/0126878 A1 | 5/2012 | Gagne et al. | |
| 2014/0333608 A1* | 11/2014 | Okairi | G09G 3/3648 |
| | | | 345/214 |
| 2015/0137774 A1 | 5/2015 | Weis et al. | |
| 2016/0094219 A1 | 3/2016 | Al-Dahle et al. | |
| 2017/0023626 A1 | 1/2017 | Kung | |

* cited by examiner

SWITCHING CIRCUIT

TECHNICAL FIELD

The present disclosure relates to a switching circuit. In particular, the present disclosure relates to a switching circuit comprising a switch array having a controlled on resistance.

BACKGROUND

Transistors, such as MOSFETs, are often used as switches for switching power converters such as buck converters and boost converters. When used in power conversion applications, these switches are typically referred to as power switches.

FIG. 1 is a schematic of a transistor 100 that may be used as a power switch, and a controller 102 that is coupled to a gate of the of the transistor 100. The transistor 100 is operable in an on state, in which current is permitted to flow between its drain and source terminals, and an off state in which no current is permitted to flow between its drain and source terminals. In the on state, the transistor 100 has an associated on resistance Rdson, and as such, the transistor 100 in the on state may be represented by a resistor 104 as shown in FIG. 1.

For a lower on resistance Rdson of the transistor 100, there is a lower voltage drop across the drain and source terminals of the transistor 100 for a given current, and a lower amount of heat generated for a given current. A smaller voltage drop and less heat generation is beneficial in increasing the efficiency of a system implementing the transistor 100.

The on resistance Rdson of the transistor 100 is unsuitable for use in sensing current as the on resistance Rdson is susceptible to variation, for example due to variations in voltage, temperature and process/manufacturing.

FIG. 2A is a schematic of the transistor 100 coupled in series with a sense resistor 200. Common features between Figures share common reference numerals. The sense resistor 200, which has a resistance R, is used to measure a current. When an unknown current is passed through the sense resistor 200, there is a measurable voltage drop $\Delta V$ across the sense resistor 200. Using Ohm's Law, and the combination of the known resistance R and the voltage drop $\Delta V$ it is possible to calculate the instantaneous current flowing through the sense resistor 200 and the transistor 100.

As the transistor 100 is coupled in series to the sense resistor 200, the current flowing through the sense resistor 200 is equal to the current flowing through the transistor 100. Therefore, measurement of the current flowing through the sense resistor 200 is a suitable method to measure the current flowing through the transistor 100.

The sense resistor 200 may be referred to as a precision resistor, as the value of the resistance R is known to a sufficiently high degree of accuracy to determine the current, and the resistance R also does not vary substantially during normal operating conditions.

FIG. 2B is a schematic of the transistor 100 coupled in series with the sense resistor 200 and comprising an operational amplifier 202 and an analog to digital converter (ADC) 204. Common features between Figures share common reference numerals. The operational amplifier 202 and ADC 204 are used to measure the voltage drop $\Delta V$ across the sense resistor 200 and to convert the measured voltage drop $\Delta V$ from an analog to a digital value.

The sense resistor 200 may be implemented in a circuit to measure the current at a particular point in time, which is commonly referred to as the instantaneous current. Measurement of the instantaneous current is a necessary feature in many systems, however, addition of the sense resistor 200 lowers the efficiency of the system and produces extra heat.

The voltage drop $\Delta V$ across the sense resistor 200 is proportional to the current in the circuit and is also proportional to the resistance R of the sense resistor 200, in accordance with Ohm's Law. Reducing the resistance R of the sense resistor 200, for example by using a smaller sense resistor 200, will improve the efficiency of the circuit, as power loss and excess heat is reduced, but will also result in a proportionally smaller voltage drop $\Delta V$. As the voltage drop $\Delta V$ is measured to determine the current, a smaller voltage drop $\Delta V$ means that more sophisticated voltage detection circuitry is required to measure the voltage drop $\Delta V$ to a sufficiently high accuracy that enables accurate determination of the current. This can increase the cost of implementing current sensing using a sense resistor 200.

SUMMARY

It is desirable to provide a switch with an on resistance that is less susceptible to at least one of voltage variations, temperature variations and process/manufacturing variations when compared with the prior art.

According to a first aspect of the disclosure there is provided a switching circuit for providing a switch array having an on resistance, comprising the switch array comprising a plurality of switches, wherein each switch is arranged to be in one of a plurality of configuration states, the configuration states comprising an enabled configuration and a disabled configuration, wherein each switch is arranged to operate in one of a plurality of switching states when in the enabled configuration, the switching states comprising an on state and an off state, and each switch is held in the off state when in the disabled configuration, control circuitry configured to set each of the switches to either the enabled configuration or the disabled configuration, and a memory element coupled to the control circuitry and arranged to store configuration data for setting the configuration state of each of the switches; wherein the control circuitry is configured to set the configuration state of each of the switches based on a configuration signal received from the memory element, the configuration signal being dependent on the configuration data, and the on resistance of the switch array is dependent on the switching state of the switches and their individual on resistances.

Optionally, the control circuitry is configured to receive a switching state signal from a switching controller and to control the switching state of the switches that are in the enabled configuration in response to the switching state signal.

Optionally, the switches of the switch array are coupled in parallel.

Optionally, each switch comprises a MOSFET.

Optionally, the configuration data comprises a plurality of configuration values and the configuration signal is dependent on at least one of the configuration values.

Optionally, the memory element is configured to receive an input, the configuration value that the configuration signal is dependent on is selected based on the input.

Optionally, the input is provided via a user interface configured to enable a user to select the configuration value.

Optionally, the switching circuit comprises a reference MOSFET, a current source configured to provide a drain/ source current to the reference MOSFET, and a voltage detector arranged to measure a drain/source voltage of the reference MOSFET and to provide a signal indicative of the measured drain/source voltage as the input of the memory element for selection of the configuration value.

Optionally, the switching circuit comprises a current sensor for measuring a current flowing through the switch array, the current sensor comprising a voltage detector arranged to measure a first voltage at a first terminal of the switch array and a second voltage at a second terminal of the switch array, the current flowing through the switch array being calculated using the measured voltages.

Optionally, the current sensor is configured to determine the direction of the current flow by evaluating which is the greatest of the first voltage and the second voltage.

Optionally, the switching circuit comprises a current sensor for measuring a current flowing through the switch array, the current sensor comprising a voltage detector arranged to measure a first voltage at a first terminal of the switch array and a second voltage at a second terminal of the switch array, the current flowing through the switch array being calculated using the measured voltages.

Optionally, the current sensor is configured to determine the direction of the current flow by evaluating which is the greatest of the first voltage and the second voltage.

Optionally, the current sensor is arranged to provide a signal indicative of the direction of the current flowing through the switch array as the input of the memory element for selection of the configuration value.

Optionally, the control circuitry comprises a plurality of control logic blocks, wherein each control logic block is associated with at least one switch, and each control logic block is configured to set its associated switch or switches to either the enabled or disabled configuration.

Optionally, the control logic blocks are configured to receive a switching state signal from a switching controller and to control the switching state of their associated switch or switches that are in the enabled configuration in response to the switching state signal.

Optionally, the switches of the switch array are coupled in parallel and each switch comprises a MOSFET, the switching circuit comprising a voltage detector configured to measure the gate voltage of one of the MOSFETs and the source voltage of the parallel combination of MOSFETs, and to provide a signal indicative of the measured gate/source voltage as the input of the memory element for selection of the configuration value.

Optionally, the switching circuit comprises a temperature sensor configured to measure a temperature and to provide a signal indicative of the measured temperature as the input of the memory element for selection of the configuration value.

Optionally, the switching circuit comprises a voltage detector configured to measure the drain or source voltage of a parallel combination of the MOSFETs and to adjust the gate voltage of at least one of the MOSFETs in response to the measured drain or source voltage.

Optionally, the memory element is configured to store gate voltage data comprising a plurality of gate voltage values for setting the gate voltage of at least one of the MOSFETs, the voltage detector is arranged to provide a signal indicative of the measured drain or source voltage as an input of the memory element for selection of a gate voltage value, and the control circuitry is configured to set the gate voltage of at least one of the MOSFETs based on a gate voltage signal received from the memory element, the gate voltage signal being dependent on the selected gate voltage value.

Optionally, each switch comprises one or more sub-switches.

Optionally, the implementation of sub-switches uses a binary weighting scheme.

Optionally, the memory element comprises non-volatile memory for storing the configuration data.

According to a second aspect of the disclosure there is provided a method of generating configuration data for a switching circuit comprising a switch array having an on resistance and comprising a plurality of switches, wherein each switch is arranged to be in one of a plurality of configuration states, the configuration states comprising an enabled configuration and a disabled configuration, and a memory element coupled to the control circuit and arranged to store configuration data for setting the configuration state of each of the switches, the method comprising passing a reference current through the switch array, measuring the on resistance of the switch array, adjusting the number of switches in an on state until a target on resistance is measured, and storing calibration data relating to the switches that are in the on state as at least a portion of the configuration data, when the target on resistance is measured.

Optionally, the method comprises repeating for a range of gate/source voltages of the switch array passing a reference current through the switch array, measuring the on resistance of the switch array, and adjusting the number of switches in an on state until a target on resistance is measured, and storing calibration data relating to the switches that are in the on state as a different configuration value for each of the gate/source voltages.

Optionally, the method comprises repeating for a range of temperatures of the switch array passing a reference current through the switch array, measuring the on resistance of the switch array, and adjusting the number of switches in an on state until a target on resistance is measured, and storing calibration data relating to the switches that are in the on state as a different configuration value for each of the temperatures.

According to a third aspect of the disclosure there is provided a method of providing a switch array having an on resistance, the switch array comprising a plurality of switches, wherein each switch is arranged to be in one of a plurality of configuration states, the configuration states comprising an enabled configuration and a disabled configuration, wherein each switch is arranged to operate in one of a plurality of switching states when in the enabled configuration, the switching states comprising an on state and an off state, and each switch is held in the off state when in the disabled configuration, wherein the on resistance of the switch array is dependent on the switching state of the switches and their individual on resistances, the method comprising storing configuration data for setting the configuration state of each of the switches using a memory element coupled to control circuitry, receiving a configuration signal at the control circuitry from the memory element, the configuration signal being dependent on the configuration data, and setting the configuration state of each of the switches using control circuitry, the configuration state being based on the configuration signal.

It will be appreciated that the method of the third aspect may include providing and/or using the features set out in the first aspect and can incorporate other features as described herein.

According to a fourth aspect of the disclosure there is provided a switching circuit for providing a switch array having an on resistance, comprising the switch array comprising a plurality of switches, wherein each switch is arranged to operate in one of a plurality of switching states, the switching states comprising an on state and an off state, control circuitry configured to set a control voltage of at least one of the switches, and a memory element coupled to the control circuitry and configured to store control voltage data comprising a plurality of control voltage values for setting the control voltage of at least one of the switches, wherein the control circuitry is configured to set the control voltage of at least one of the switches based on a control voltage signal received from the memory element, the control voltage signal being dependent on the control voltage data, and the on resistance of the switch array is dependent on the switching state of the switches and their individual on resistances.

Optionally, each switch comprises a MOSFET, the control voltage is a gate voltage, the control voltage data is gate voltage data, the control voltage values are gate voltage values, and the control voltage signal is a gate voltage signal; the switching circuit comprising a voltage detector configured to measure the drain or source voltage of a parallel combination of the MOSFETs and to provide a signal indicative of the measured drain or source voltage as an input of the memory element for selection of a gate voltage value, wherein the control circuitry is configured to set the gate voltage of at least one of the MOSFETs based on a gate voltage signal received from the memory element, the gate voltage signal being dependent on the selected gate voltage value.

It will be appreciated that the switching circuit of the fourth aspect may include the features set out in the first aspect and can incorporate other features as described herein.

According to a fifth aspect of the disclosure there is provided a method of providing a switching circuit for providing a switch array having an on resistance, the switch array comprising a plurality of switches, wherein each switch is arranged to operate in one of a plurality of switching states, the switching states comprising an on state and an off state, the method comprising storing control voltage data comprising a plurality of control voltage values for setting the control voltage of at least one of the switches using a memory element, setting the control voltage of at least one of the switches using control circuitry, based on a control voltage signal received at the control circuitry from the memory element, the control voltage signal being dependent on the control voltage data, wherein the on resistance of the switch array is dependent on the switching state of the switches and their individual on resistances.

It will be appreciated that the method of the fifth aspect may include providing and/or using the features set out in the fourth aspect and can incorporate other features as described herein.

BRIEF DESCRIPTION OF THE DRAWINGS

The disclosure is described in further detail below by way of example and with reference to the accompanying drawings, in which.

DESCRIPTION

Figure 3B:
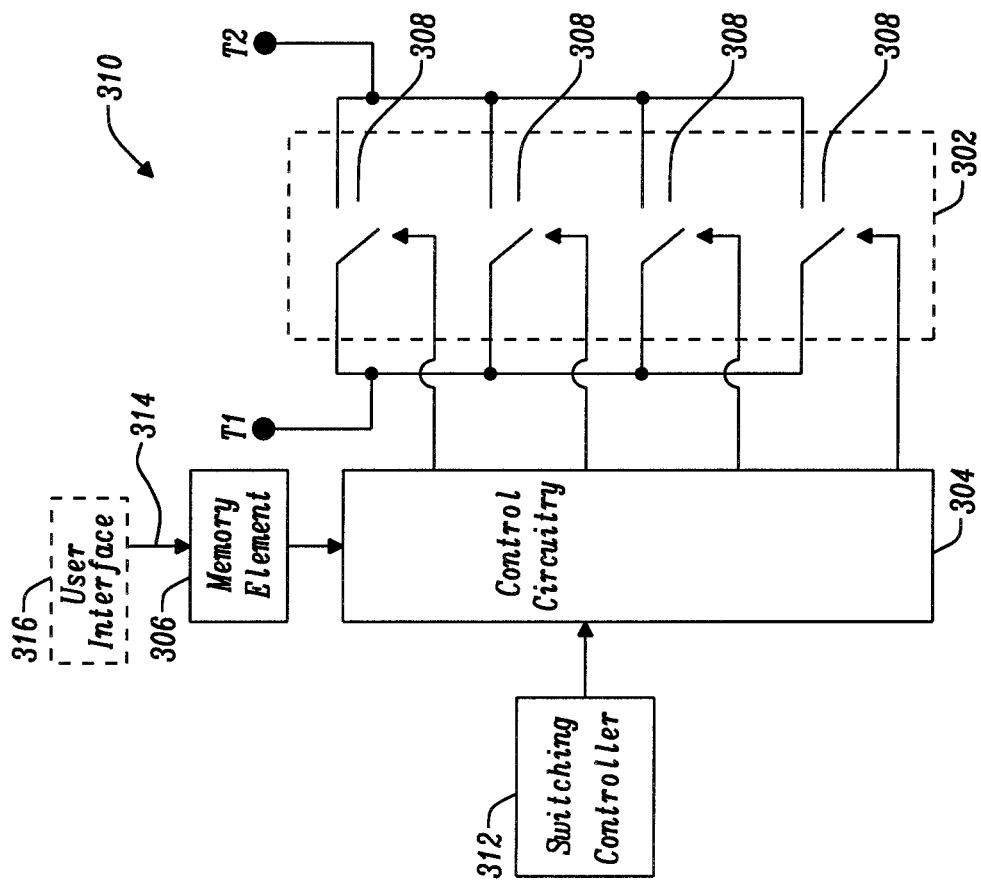
FIG. 3A is a schematic of a switching circuit in accordance with a first embodiment of the present disclosure and FIG. 3B is a schematic of a switching circuit in accordance with a second embodiment of the present disclosure.
Figure 3A:
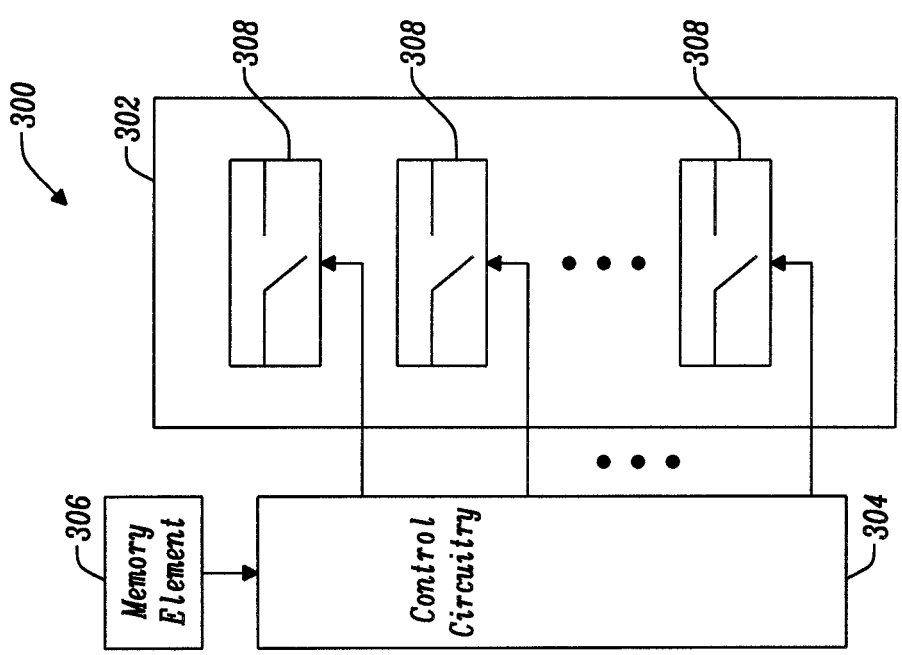

FIG. 3A is a schematic of a switching circuit 300 for providing a switch array 302 having an on resistance in accordance with a first embodiment of the present disclosure.

The switching circuit 300 comprises the switch array 302, control circuitry 304 and a memory element 306. The switch array 302 comprises a plurality of switches 308. Each switch 308 is arranged to be in one of a plurality of configuration states. The configuration states comprise an enabled configuration and a disabled configuration.

If a switch 308 is in the enabled configuration it can operate in one of a plurality of switching states. The switching states comprise an on state and an off state. If a switch 308 is in the disabled configuration the switch 308 is held in the off state.

When a switch 308 is in the on state, current is permitted to flow between its terminals. When a switch 308 is in the off state, no current is permitted to flow between its terminals.

The control circuitry 304 is configured to set each of the switches 308 to either the enabled configuration or the disabled configuration.

The memory element 306 is coupled to the control circuitry 304 and is arranged to store configuration data. The configuration data is suitable for setting the configuration state of each of the switches 308.

In operation the control circuitry 304 is configured to set the configuration state of each of the switches 308 based on a configuration signal that is received from the memory element 306. The configuration signal is dependent on the configuration data stored in the memory element 306. The memory element 306 may comprise non-volatile memory (NVM) for storing the configuration data.

FIG. 3B is a schematic of a switching circuit 310 for providing the switch array 302 having a on resistance in accordance with a second embodiment of the present disclosure. The switching circuit 310 corresponds to the switching circuit 300, however in this specific embodiment the control circuitry 304 is configured to receive a switching state signal from a switching controller 312. The control circuitry 304 controls the switching state of the switches 308 that are in the enabled configuration in response to the switching state signal. In this specific embodiment, the switches 308 of the switch array 302 are coupled in parallel and the plurality of switches 308 comprises four switches. Common features between different Figures are represented by common reference numerals and common variables.

The configuration data stored in the memory element 306 comprises a plurality of configuration values. The configuration values may be stored in a look up table (LUT) or any other suitable data storage structure such as a database or a spreadsheet. The configuration values may be numerical values or any other appropriate data type in accordance with the understanding of the skilled person. The configuration signal that is provided to the control circuitry 304 is dependent on at least one of the configuration values. The configuration value or values that the configuration signal is dependent on may be selected based on an input 314 received by the memory element 306.

The input 314 may be provided via a user interface 316 that enables a user to manually select a configuration value. For example, the user interface may be implemented in computer software that enables the user to select the configuration value from a list. The selected configuration value can then be used to provide the appropriate configuration signal to set the configuration state of the switches 308 in accordance with the user's input.

The user interface may allow the user to manually select the number of switches 308 to be in an enabled or disabled configuration state. Alternatively, the user interface may allow the user to manually select the configuration state of each individual switch 308. The appropriate configuration value will be selected based on the user's interaction with the interface and the resultant configuration signal will appropriately set the configuration state of the switches 308 based on the user's input.

Figure 1:
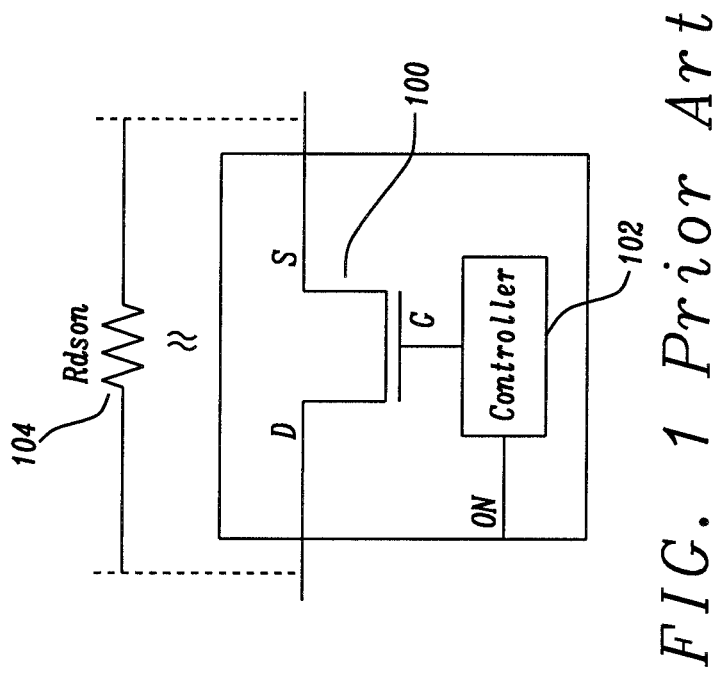
FIG. 1 is a schematic of a transistor and a controller.

The switches 308 are coupled in parallel at a first terminal T1 and a second terminal T2. The on resistance of the switch array 302 may be measured across the terminals T1, T2 and is dependent on the switching state of the switches 308 and their individual on resistances. As discussed previously for the transistor 100 of FIG. 1, the on resistance of a switch 308 is its resistance when it is in the on state.

Therefore, the embodiments presented in FIGS. 3A and 3B provide a means of adjusting the on resistance of the switch array 302 by changing the configuration state of the individual switches 308.

Figure 4:
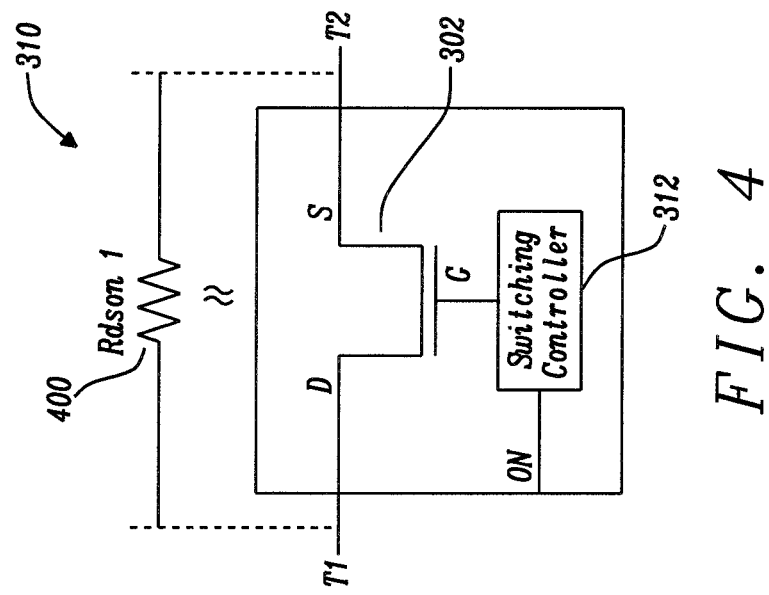
FIG. 4 is an alternative schematic of the switching circuit of FIG. 3B.

FIG. 4 shows an alternative representation of the switching circuit 310. The switch array 302 is represented by a single MOSFET with an on resistance Rdson1. Compared to the transistor 100 of FIG. 1, the switching circuit 310 has a variable and controllable on resistance Rdson1. The on resistance Rdson1 of the switch array 302 is dependent on the switching state of the switches 308 of the switch array 302, and their individual on resistances as discussed previously. The on resistance Rdson1 of the switch array 302 is represented by a resistor 400. The control circuitry 304, the memory element 306, the switching controller 312 and the user interface 316 have been omitted in the drawing of FIG. 4 to aid clarity in the simplified representation of the switching circuit 310.

The switching circuit 310 may be implemented as a MOSFET based power switch, for example in a switching converter. The switching controller 312 drives the switching operation of the switch array 302 by providing the switching state signal, where the switching state signal is used to control the switching state of the switches 308 that are in the enabled configuration.

Figure 5:
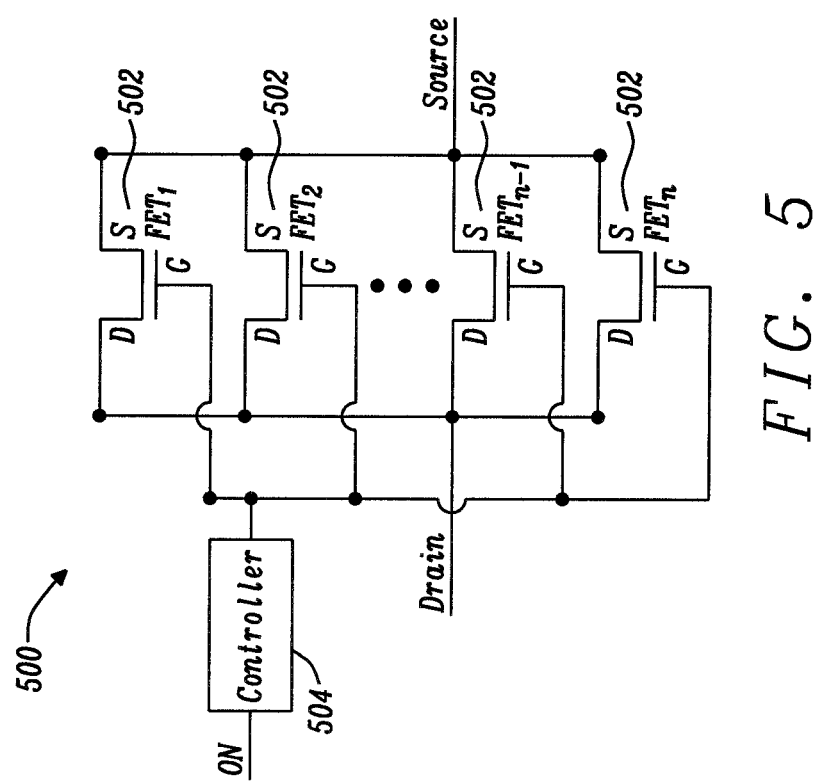
FIG. 5 is a schematic of a power switch comprising MOSFETs, and a controller.
Figure 6:
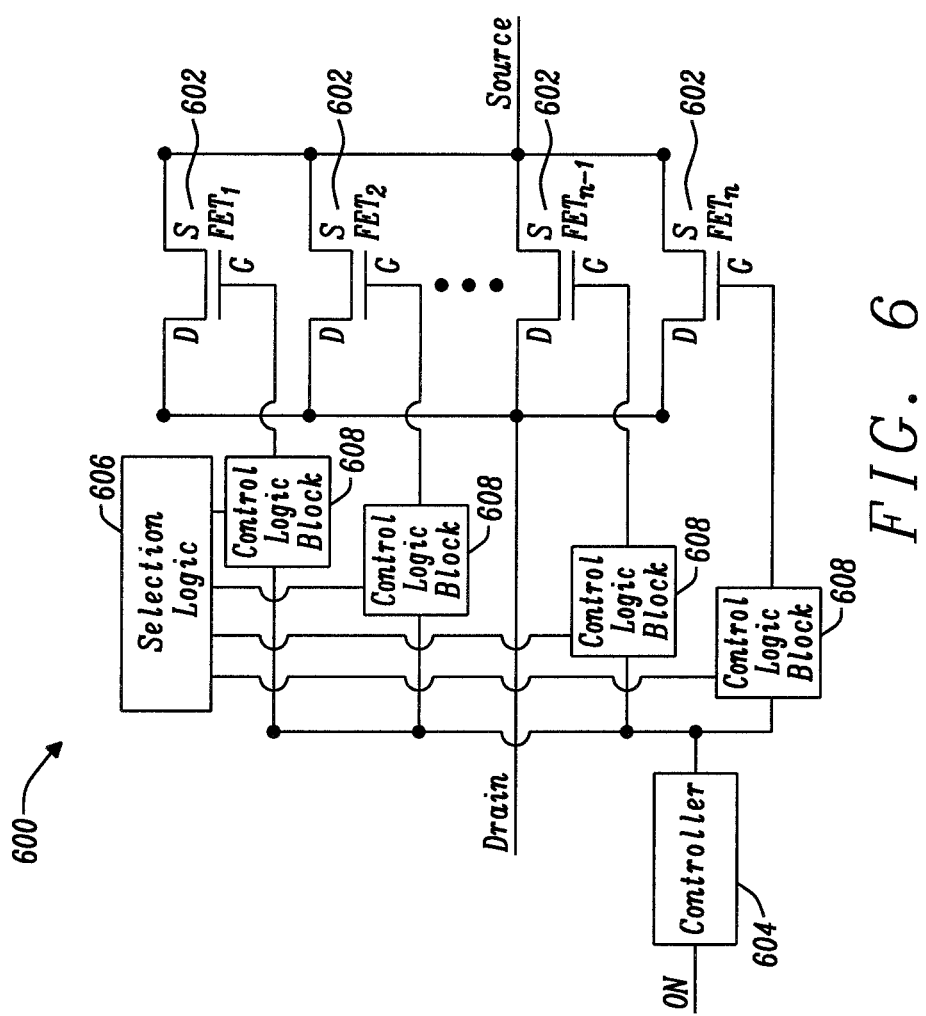
FIG. 6 is a schematic of a power switch comprising MOSFETs, a controller, selection logic and control logic blocks.

FIG. 5 is a schematic of a power switch 500 comprising an array of MOSFETs 502 coupled in parallel and each configured to receive a control signal from a controller 504. FIG. 6 is a schematic of a power switch 600 comprising an array of MOSFETs 602 coupled in parallel and each configured to receive a control signal from a controller 604. The power switch 600 comprises selection logic 606 and control logic blocks 608. The selection logic 606 and the control logic blocks 608 allows some or all of the individual MOSFETs 602 in the array to be disabled so the disabled MOSFETs will not be switched to an on state when the overall array is activated by the control signal provided by the controller 604.

Figure 7:
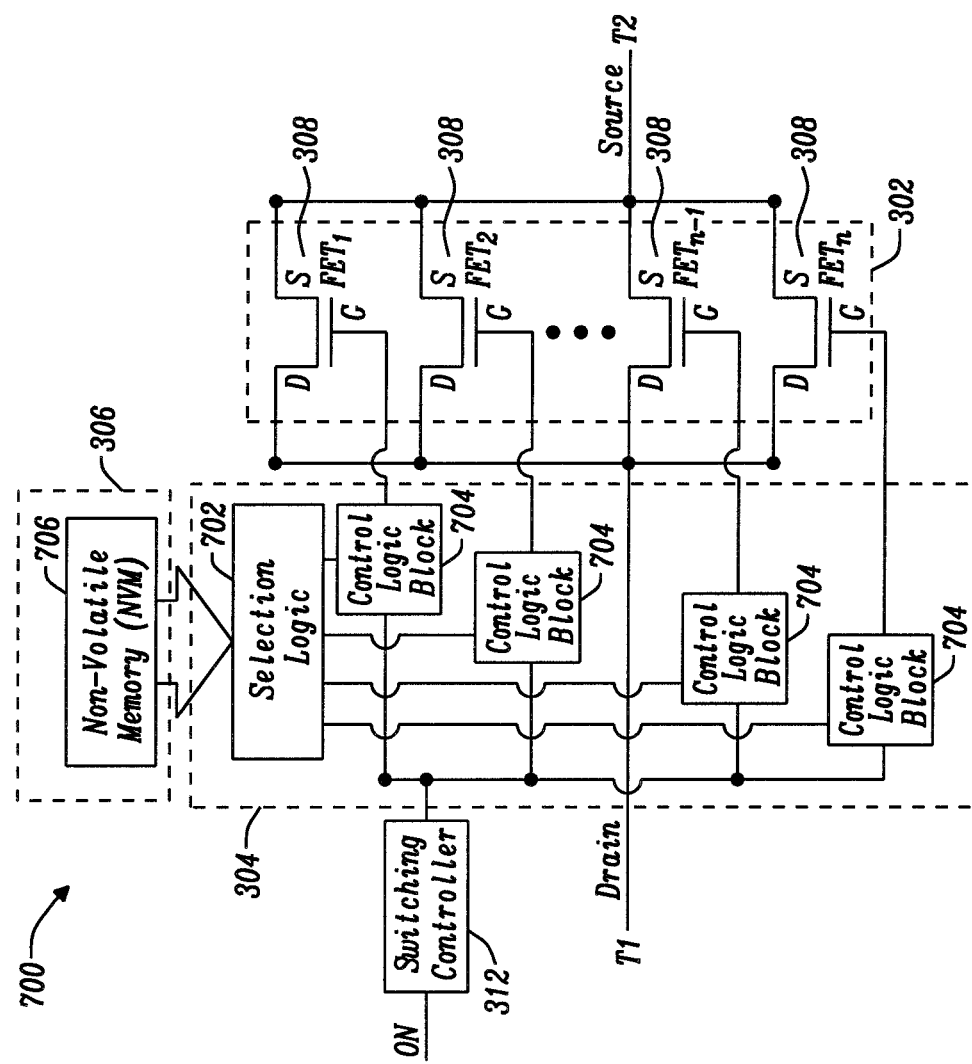
FIG. 7 is a schematic of a switching circuit in accordance with a third embodiment of the present disclosure.

FIG. 7 is a schematic of a switching circuit 700 in accordance with a third embodiment of the present disclosure. The switching circuit 700 corresponds to the switching circuit 310 with specific implementations of the switch array 302, the control circuitry 304, the memory element 306 shown. Common features between different Figures are represented by common reference numerals and common variables.

The switch array 302 comprises a plurality of switches 308 and each switch 308 comprises a MOSFET. The control circuitry 304 comprises selection logic 702 and a plurality of control logic blocks 704. Each control logic block 702 is associated with at least one switch 308. Each control logic block 704 is configured to set its associated switch 308 or switches 308 to either the enabled or disabled configuration. The control logic blocks 704 are configured to receive a switching state signal from the switching controller 312 and to control the switching state of their associated switch 308 or switches 308 that are in the enabled configuration in response to the switching state signal.

In the specific embodiment shown, each control logic block 704 is coupled to a gate of an associated switch 308. In operation, the selection logic 702 receives the configuration signal from the memory element 306. The selection logic 702 then provides a signal to each of the control logic blocks 704, and in response each control logic block 704 sets the configuration state of its associated switch 308.

The memory element 306 comprises non-volatile memory (NVM) 706. The NVM 706 may comprise a calibration register that is used to store one or more configuration values that can define which of the switches 308 in the switch array 302 are in the enabled configuration or the disabled configuration.

The drains of each of the switches are coupled at terminal T1 and therefore the terminal T1 may be referred to as the drain terminal of the switch array 302. The sources of each of the switches 308 are coupled at the terminal T2 and therefore the terminal T2 may be referred to as the source terminal of the switch array 302. The control circuitry 304 allows the switch array 302 to be calibrated during production testing to remove the natural processing/manufacturing variation of the on resistance Rdson1 of the switch array 302 that arises due to processing/manufacturing variations of the on resistance of the individual switches 308. The following method may be used to establish a baseline, precision on resistance Rdson1 for the switch array 302.

A method of generating configuration data for the switching circuit 700 comprises passing a reference current through the switch array 302 and measuring the on resistance Rdson1 of the switch array 302. The reference current will be passed between the terminals T1, T2. The number of switches 308 in the on state can then be adjusted until a target on resistance Rdson1 is measured. Calibration data relating to the number of switches that are in the on state for a target on resistance Rdson1 can then be stored as at least a portion of the configuration data that is stored in the memory element 306. It is then possible to set the number of switches 308 in the enabled configuration to achieve the target on resistance Rdson1.

With regards to the specific embodiment presented in FIG. 7, the NVM 706 is used to store a calibration value and the test procedure involves passing a known reference current between the terminals T1, T2 and adjusting the calibration value, which in turn changes the signals provided by the selection logic 702 to the control logic blocks 704. The switching controller 312 acts to hold the enabled switches 308 in the on state, and the calibration value is adjusted until the desired on resistance Rdson1 is measured.

Figure 8:
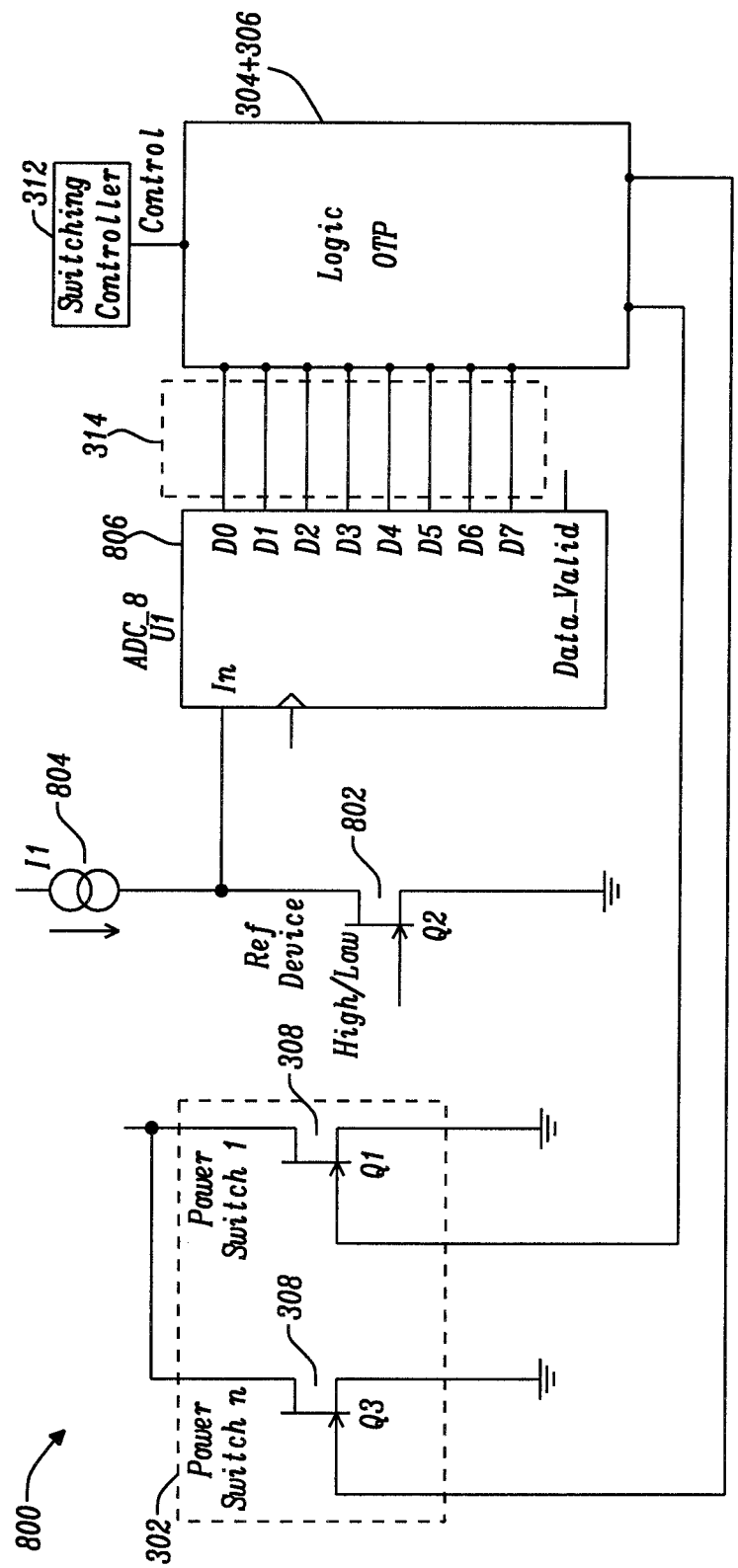
FIG. 8 is a schematic of a switching circuit in accordance with a fourth embodiment of the present disclosure.

FIG. 8 is a schematic of a switching circuit 800 in accordance with a fourth embodiment of the present disclosure. The switching circuit 800 corresponds to the switching circuit 310, but further comprises a reference MOSFET 802 and a current source 804 and an analog to digital converter (ADC) 806 which is a type of voltage detector. Common features between different Figures are represented by common reference numerals and common variables.

In operation, the current source 804 provides a drain/source current to the reference MOSFET 802. The drain/source current is the current flowing between the drain and source terminals of the reference MOSFET 802. The drain/source current results in the generation of a drain/source voltage of the reference MOSFET 802 that is measured using the ADC 806. The drain/source voltage is the voltage across the drain and source terminals of the reference MOSFET 802. The ADC 806 then provides a signal indicative of the measured drain/source voltage as the input 314 of the memory element 306 for selection of the configuration value stored in the NVM that will determine which switches 308 in the switch array 302 are in the enabled configuration for a particular operating condition.

The current source 804 may be TC stable, in that the current source 804 provides a constant current independent of temperature and process variations. The drain/source voltage of the reference MOSFET 802 will change over process and temperature variations and therefore will exhibit similar process and temperature variations as the switches 308 of the switch array 302. Therefore, the measured drain/source voltage of the reference MOSFET 802 can be used as a selection index to find a configuration value to nullify these effects in the switch array 302. Preferably, the reference MOSFET 802 should be physically positioned near the middle of the switch array 302 for good temperature tracking and process matching.

Figure 9:
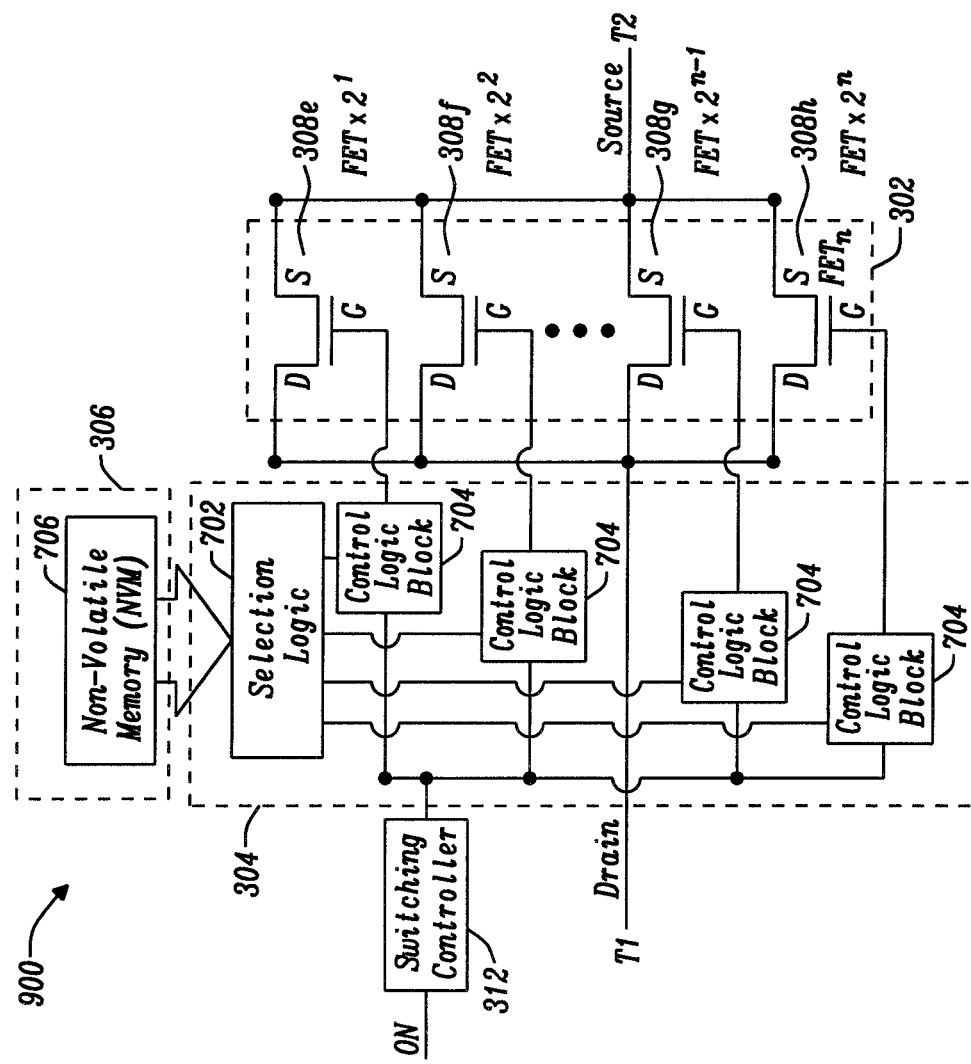
FIG. 9 is a schematic of a switching circuit in accordance with a fifth embodiment of the present disclosure.

FIG. 9 is a schematic of a switching circuit 900 in accordance with a fifth embodiment of the present disclosure. The switching circuit 900 corresponds to the switching circuit 700, however in this specific embodiment the switch array 302 uses a weighting scheme. Each individual switch 308, as previously described comprises an array of parallel coupled sub-switches. The term "sub-switches" is used to distinguish between the switches 308 of the switch array 302 and the individual switches (sub-switches) that can make up each of the switches 308. Common features between different Figures are represented by common reference numerals and common variables.

The weighting scheme may for example be a binary weighting scheme, as follows. A first switch 308e comprises $2^1$ sub-switches coupled in parallel, a second switch 308f comprises $2^2$ sub-switches coupled in parallel, an (n−1)th switch 308g comprises (n−1) sub-switches and an n-th switch 308h comprises $2^n$ sub-switches coupled in parallel, where n is an integer number corresponding to the number of switches in the switch array 302.

A weighting scheme can be used to reduce the amount of circuitry required to implement the selection logic 702 and control logic blocks 704 whilst providing the same level of granularity of control as the switching circuit 700.

Figure 10A:
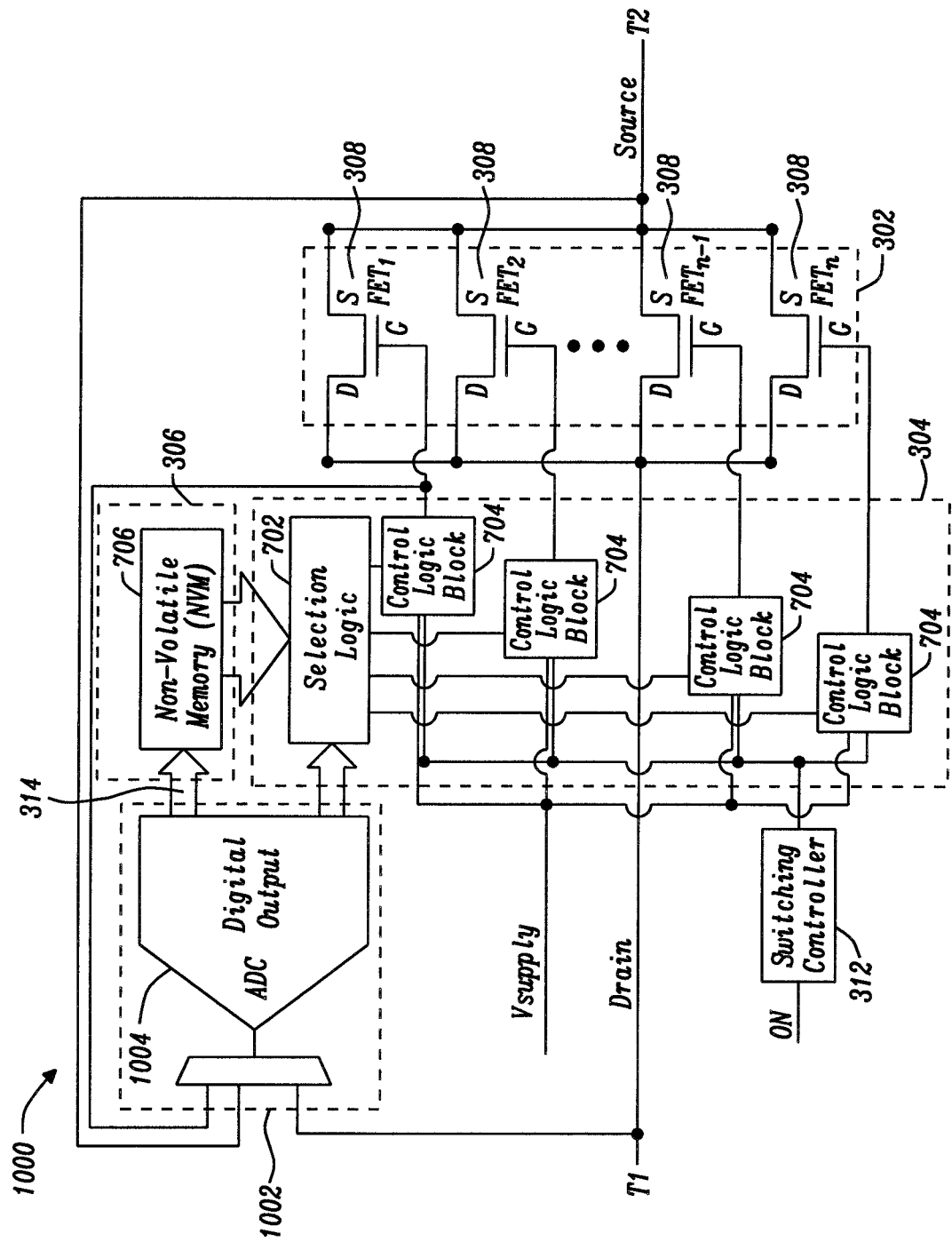
FIG. 10A is a schematic of a switching circuit in accordance with a sixth embodiment of the present disclosure.

FIG. 10A is a schematic of a switching circuit 1000 in accordance with a sixth embodiment of the present disclosure. The switching circuit 1000 corresponds to the switching circuit 700, but further comprises a voltage detector 1002. Common features between different Figures are represented by common reference numerals and common variables.

The switches 308 of the switch array 302 are coupled in parallel and each switch comprises a MOSFET. In operation the voltage detector 1002 measures the gate voltage of one of the MOSFETs and measures source voltage of the parallel combination of MOSFETs (at the terminal T2). The voltage detector 1002 then provides a signal indicative of the measured gate/source voltage of the switch array 302 as the input 314 of the memory element 306 for selection of the configuration value.

The gate/source voltage of the switch array 302 is the voltage across the gate of one of the MOSFETs (as measured) and the source of the parallel combination of MOSFETs (as measured). It is only necessary to measure the gate voltage of a single MOSFET in this embodiment, as all MOSFETs will receive approximately the same gate voltage. In a further embodiment, different MOSFETs may receive different gate voltages, and therefore the gate/source voltage will be dependent on the MOSFET that is chosen for measurement of its gate voltage. For different MOSFETs receiving different gate voltages, the MOSFET that is chosen for the gate voltage measurement will be dependent on the understanding of the skilled person.

The inclusion of the voltage detector 1002 provides an internal mechanism to nullify the variation of the Rdson1 of the switch array 302 caused by changes to the gate/source voltage of the switch array 302.

The switch array 302 can be calibrated to remove the variation of the on resistance Rdson1 of the switch array 302 that arises due variations in the gate/source voltage of the switch array 302. The following calibration method may be used to establish a baseline, precision on resistance Rdson1 for the switch array 302 for different gate/source voltages of the switch array 302. The calibration method may be carried out during testing of individual production units of the switching circuit 1000. The calibration method may be used to establish the relationship between gate/source voltage variation of the switch array 302 and the on resistance Rdson1 of the switch array 302.

A method of generating configuration data for the switching circuit 1000 comprises passing a reference current through the switch array 302 for a range of gate/source voltages and measuring the on resistance Rdson1 of the switch array 302 for the different gate/source voltages. The number of switches 308 in the on state can then be adjusted until a target on resistance Rdson1 is measured for each of the gain/source voltages. Calibration data relating to the number of switches 308 that are in the on state for a target on resistance Rdson1 can then be stored as at least a portion of the configuration data that is stored in the memory element 306. It is then possible to set the number of switches 308 in the enabled configuration to achieve the target on resistance Rdson1 for a given gate/source voltage of the switch array 302.

Using the above calibration method, the switch array 302 would have an on resistance Rdson1 with a defined level of accuracy for any input voltage at the source of the switch array 302 within the range operation of the switching circuit 1002. The input voltage is the voltage at the source of the switch array 302 (At the terminal T2). Additionally, this specification could be combined into a single guaranteed level of accuracy for the on resistance Rdson1 of the switch array 302 over a range of input voltages.

In the present embodiment the voltage detector 1002 comprises an ADC 1004 to measure the gate/source voltage of the switch array 302 over a range of input voltages. The ADC 1004 provides a signal indicative of the measured gate/source voltage as the input 314 of the memory element 306 for selection of the configuration value stored in the NVM 706 that will determine which switches 308 in the switch array 302 are in the enabled configuration for a particular gate/source voltage to provide the required on resistance Rdson1 of the switch array 302. The number of switches 308 in the enabled configuration may be selected dynamically during operation by the ADC 1004.

An alternative method to nullify the effects of changes to the source voltage at the terminal T2 is to supply a gate voltage to each of the switches 308 that is controlled within a trimmed limit either above the source voltage (when using NFETs in the switch array 302) or below the source voltage (when using PFETs in the switch array 302). NFETs are n-type MOSFETs and PFETs are p-type MOSFETS.

In a general embodiment, the control circuitry 304 is configured to set a control voltage of at least one of the switches 308. The memory element 306 is configured to store control voltage data comprising a plurality of control voltage values for setting the control voltage of at least one of the switches 308. The control circuitry 304 is configured to set the control voltage of at least one of the switches 308 based on a control voltage signal received from the memory element 306, the control voltage signal being dependent on the control voltage data.

In the specific embodiment shown in FIG. 10A, each switch 308 comprises a MOSFET and the control voltage provided to a MOSFET corresponds to its gate voltage. Additionally, the control voltage data, control voltage values and the control voltage signal corresponds to gate voltage data, gate voltage values and a gate voltage signal, respectively.

The voltage detector 1002 of the switching circuit 1000 is configured to measure the drain voltage (at the terminal T1) of a parallel combination of the switches 308 (each comprising a MOSFET) and to adjust the gate voltage of at least one of the MOSFETs in response to the measured drain voltage.

It will be appreciated that in a further embodiment, and in accordance with the understanding of the skilled person, the source voltage of the parallel combination of MOSFETs may be measured (at terminal T2) by the voltage detector 1002, and the gate voltage of at least one of the MOSFETs may be adjusted in response to the measured source voltage.

The memory element 306 is configured to store gate voltage data comprising a plurality of gate voltage values for setting the gate voltage of at least one of the MOSFETs.

In operation, the voltage detector 1002 provides a signal indicative of the measured drain voltage as the input 314 of the memory element 306 for selection of a gate voltage value. The control circuitry 304 sets the gate voltage of at least one of the MOSFETs based on a gate voltage signal received from the memory element 306. The gate voltage signal provided by the memory element 306 is dependent on the gate voltage value that was selected based on the measured drain voltage.

A supply voltage Vsupply is provided to the control logic blocks 704 which is then used to provide the gate voltage to each of the switches 308. Each control logic block 704 can adjust the gate voltage applied to its associated switch 308 to allow for any change in the drain voltage (at the terminal T1) to be compensated by a change in the gate voltage.

Figure 10B:
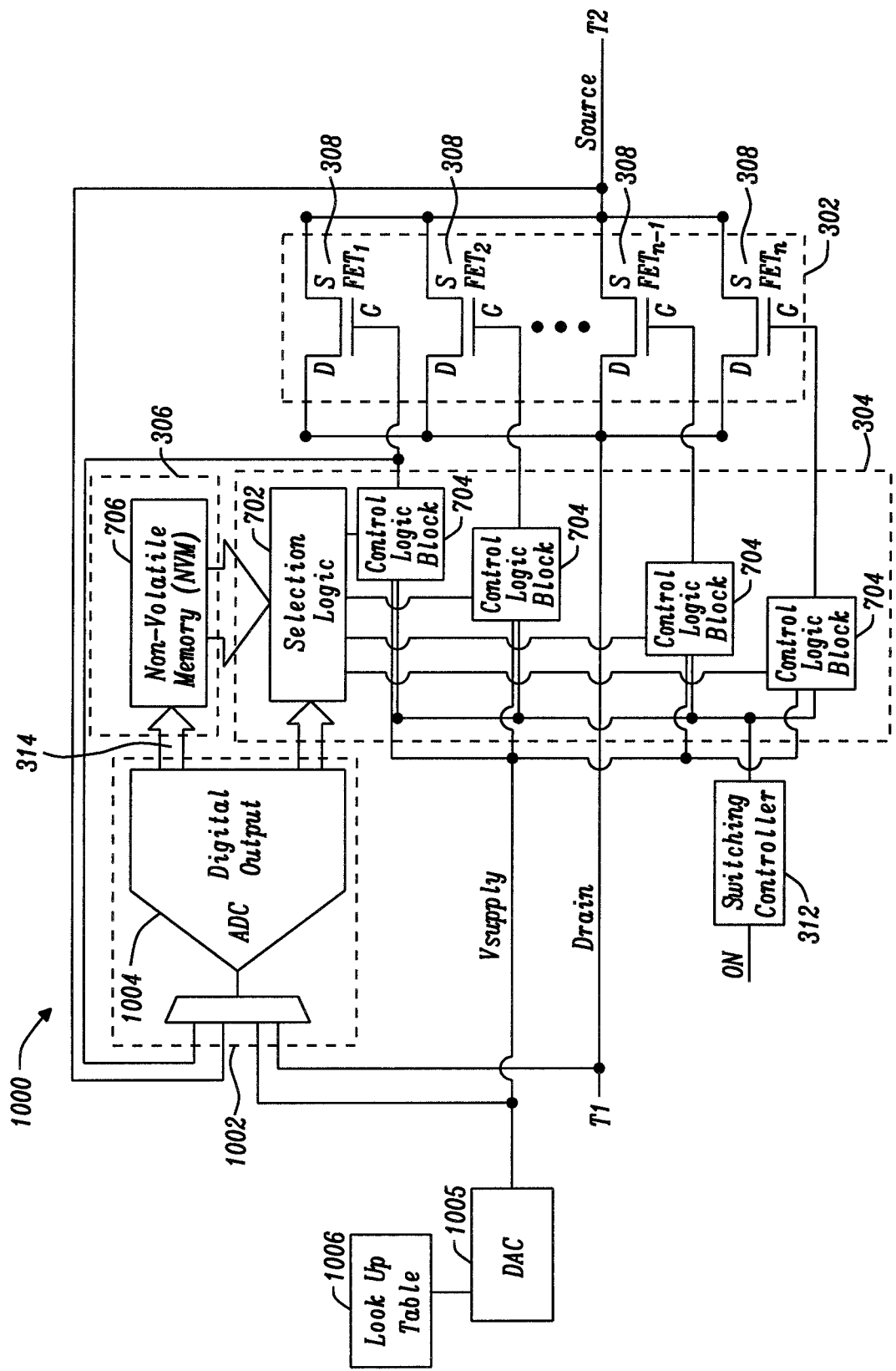
FIG. 10B is a schematic of the switching circuit of FIG. 10A further comprising a DAC.
Figure 10C:
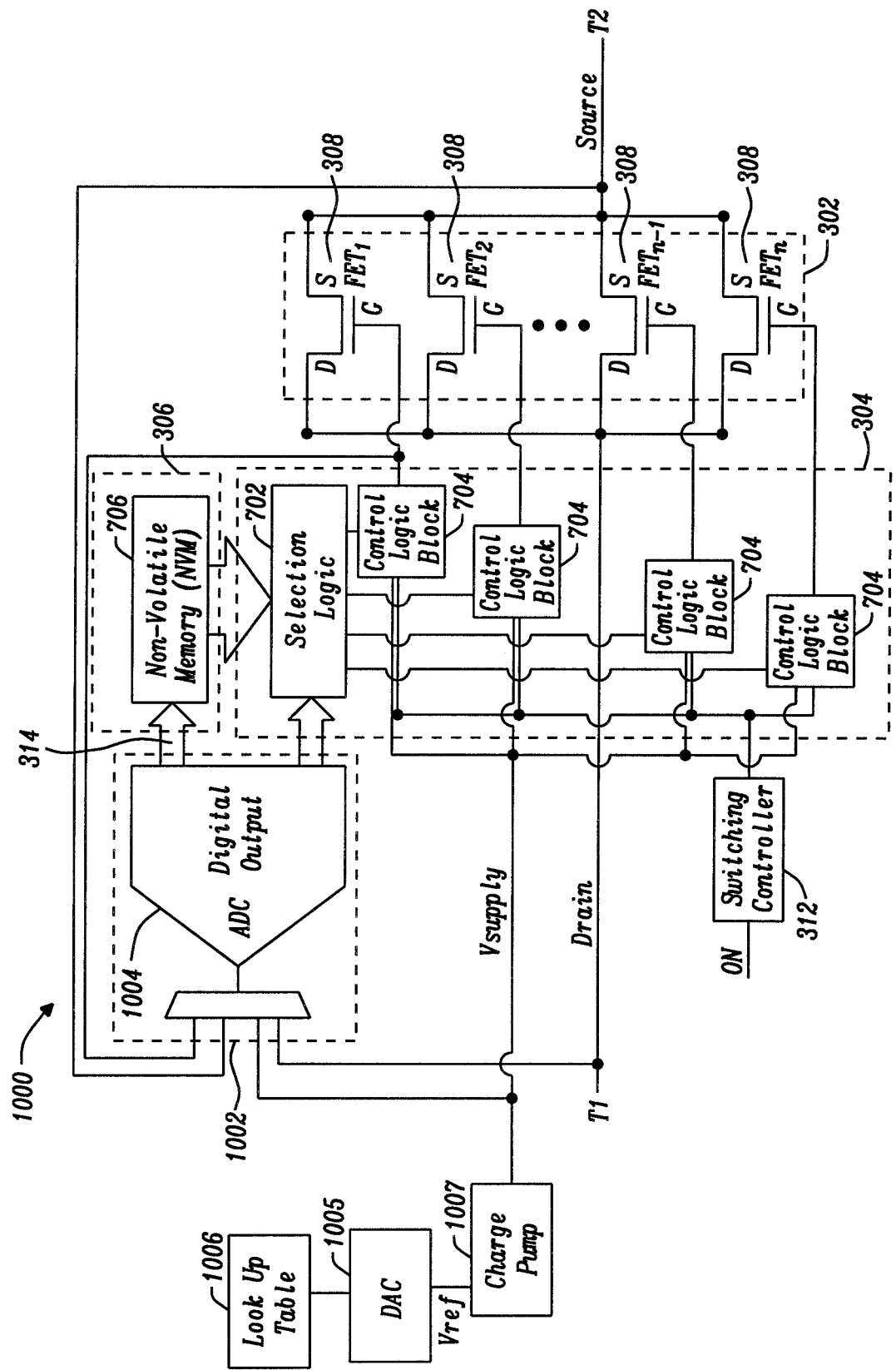
FIG. 10C is a schematic of the switching circuit of FIG. 10A further comprising a DAC and a charge pump.

FIG. 10B shows the switching circuit 1000 further comprising a digital to analog converter (DAC) 1005 and FIG. 10C shows the switching circuit 1000 further comprising the DAC 1005 and a charge pump 1007.

A digital value passed to the DAC 1005 could come from a value stored in a look up table (LUT) 1006, and could either provide the supply voltage Vsupply directly, as in FIG. 10B, or provide a reference voltage Vref to the charge pump 1007 that generates the supply voltage Vsupply, as in FIG. 10C. If the charge pump 1007 is used to generate the supply voltage Vsupply then there will be no requirement for additional trim circuitry as is the case if an output of the DAC 1005 provides the supply voltage Vsupply directly. Additionally, the charge pump 1007 provides a greater level of control over providing the supply voltage Vsupply directly from the output of the DAC 1005.

As in FIGS. 10B, 10C the supply voltage Vsupply may also be provided to the voltage detector 1002 for measurement.

Figure 10D:
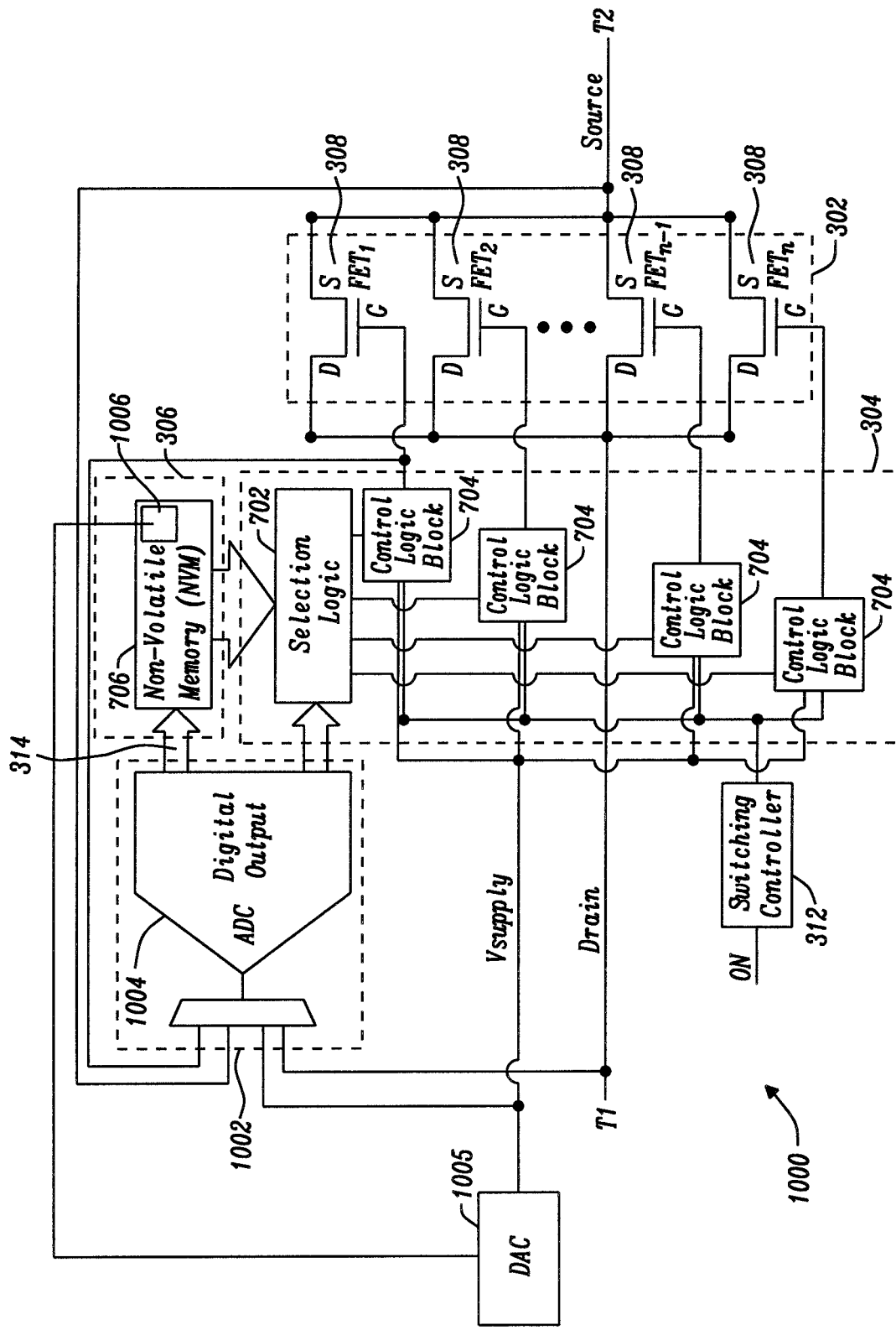
FIG. 10D is a schematic of an alternative implementation of the switching circuit of FIG. 10B.

FIG. 10D shows the switching circuit 1000 of FIG. 10B, with the LUT 1006 implemented in the memory element 306.

Figure 11:
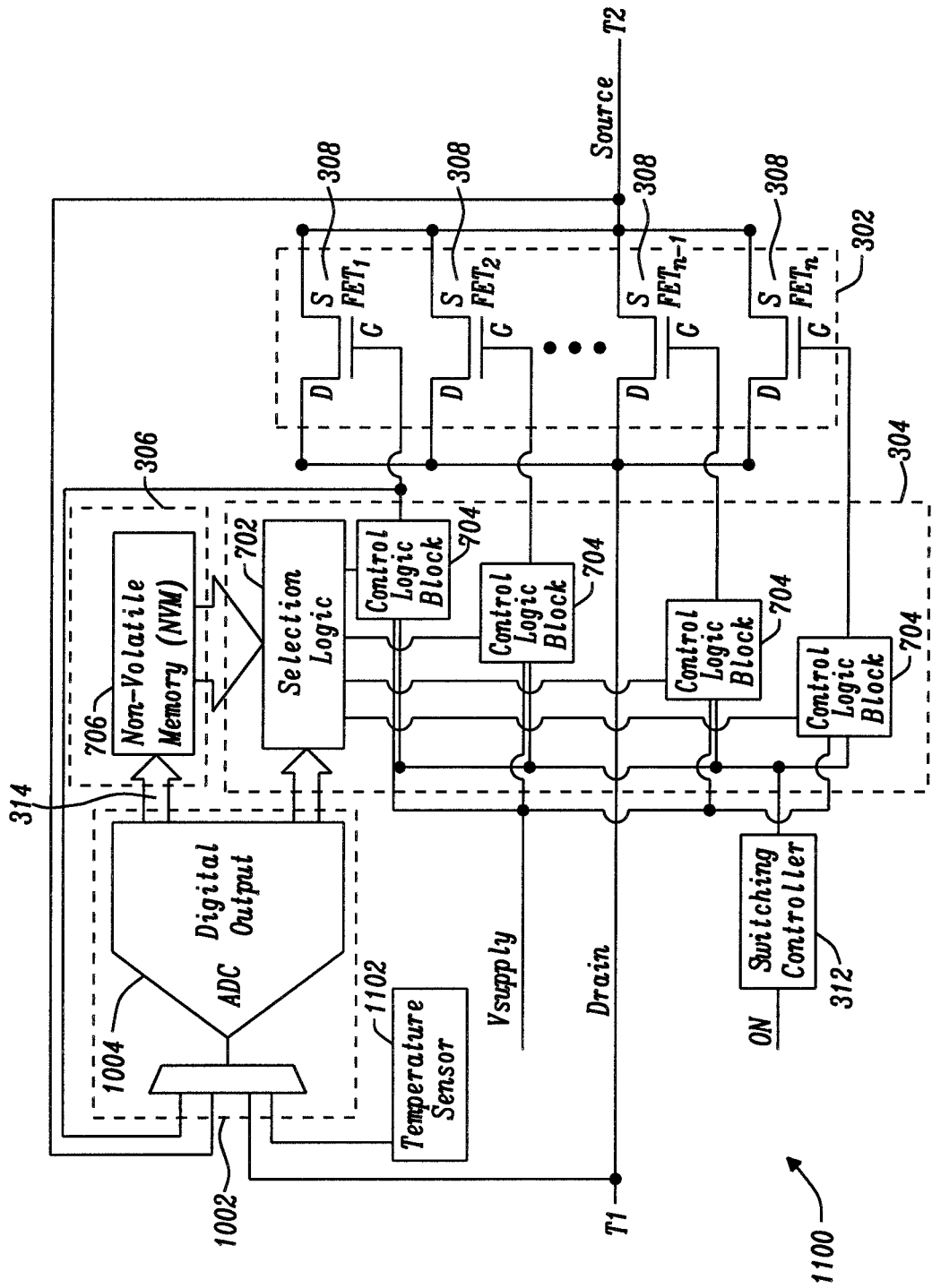
FIG. 11 is a schematic of a switching circuit in accordance with a seventh embodiment of the present disclosure.

FIG. 11 is a schematic of a switching circuit 1100 in accordance with a seventh embodiment of the present disclosure. The switching circuit 1100 corresponds to the switching circuit 1000, but further comprises a temperature sensor 1102. Common features between different Figures are represented by common reference numerals and common variables.

The temperature sensor 1102 is configured to measure a temperature and to provide a signal indicative of the measured temperature as the input 314 of the memory element 306 for selection of the configuration value.

The temperature sensor 1102 may comprise a reference transistor and the ADC 104 to digitize the instantaneous value of the temperature as measured by temperature sensor 1102 and to provide the digitised value as the input 314 for the memory element 314. It will be appreciated that the temperature sensor 1102 may be implemented independently of the gate/source voltage detection and drain voltage detection as described for the switching circuit 1000.

The inclusion of the temperature sensor 1102 provides a mechanism to nullify the variations of the Rdson1 of the switch array 302 cause by changes to the temperature of the switch array 302.

The switch array 302 can be calibrated to remove the variation of the on resistance Rdson1 of the switch array 302 that arises due variations in temperature of the switch array 302. The following calibration method may be used to establish a baseline, precision on resistance Rdson1 for the switch array 302 for different temperatures of the switch array 302. The calibration method may be carried out during testing of individual production units of the switching circuit 1100. The calibration method may be used to establish the relationship between temperature variation of the switch array 302 and the on resistance Rdson1 of the switch array 302.

A method of generating configuration data for the switching circuit 1100 comprises passing a reference current through the switch array 302 for a range of temperatures and measuring the on resistance Rdson1 of the switch array 302 for the different temperatures. The number of switches 308 in the on state can then be adjusted until a target on resistance Rdson1 is measured for each temperature. Calibration data relating to the number of switches 308 that are in the on state for a target on resistance Rdson1 can then be stored as at least a portion of the configuration data that is stored in the memory element 306. It is then possible to set the number of switches 308 in the enabled configuration to achieve the target on resistance Rdson1 for a given temperature of the switch array 302.

Using the above calibration method, the switch array 302 would have an on resistance Rdson1 with a defined level of accuracy at any temperature within the range of operation of the switch array 302. Additionally, this specification could be combined into a single guaranteed level of accuracy for the on resistance Rdson1 of the switch array 302 over a range of temperature.

The switching circuit 1100 may be used for cascaded structure, for example for a high voltage transistor for shielding.

Figure 12:
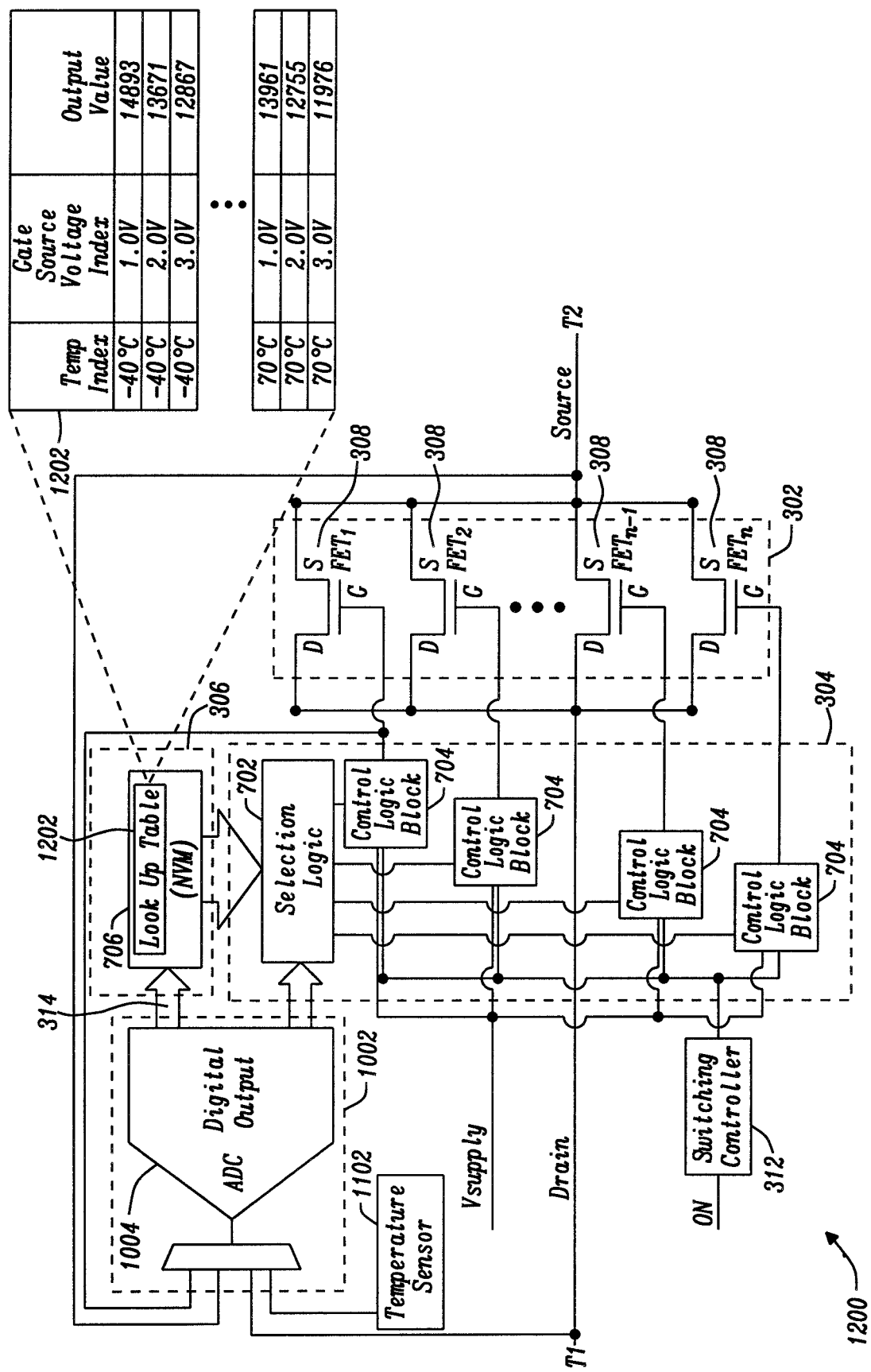
FIG. 12 is a schematic of a switching circuit in accordance with an eighth embodiment of the present disclosure.

FIG. 12 is a schematic of a switching circuit 1200 in accordance with an eighth embodiment of the present disclosure. The switching circuit 1200 corresponds to the switching circuit 1100, however in the switching circuit 1200, the NVM comprises a calibration register in the form of a look up table LUT 1202. Common features between different Figures are represented by common reference numerals and common variables.

The LUT 1202 is used to store one or more configuration values that can define which of the switches 308 in the switch array 302 are in the enabled configuration or the disabled configuration.

The LUT 1202 may include configuration values relating to one or both of temperature and gate/source voltage conditions as determined using the calibration methods described previously. The LUT 1202 can provide a suitable configuration signal to the control circuitry 304 based on the configuration value selected based on the operation conditions, where the operation conditions relate to at least one of temperature and gate/source voltage of the switch array 302. Therefore, the LUT 1202 is used to define which switches 308 should be in an enabled configuration based on the present operating conditions.

Figure 13:
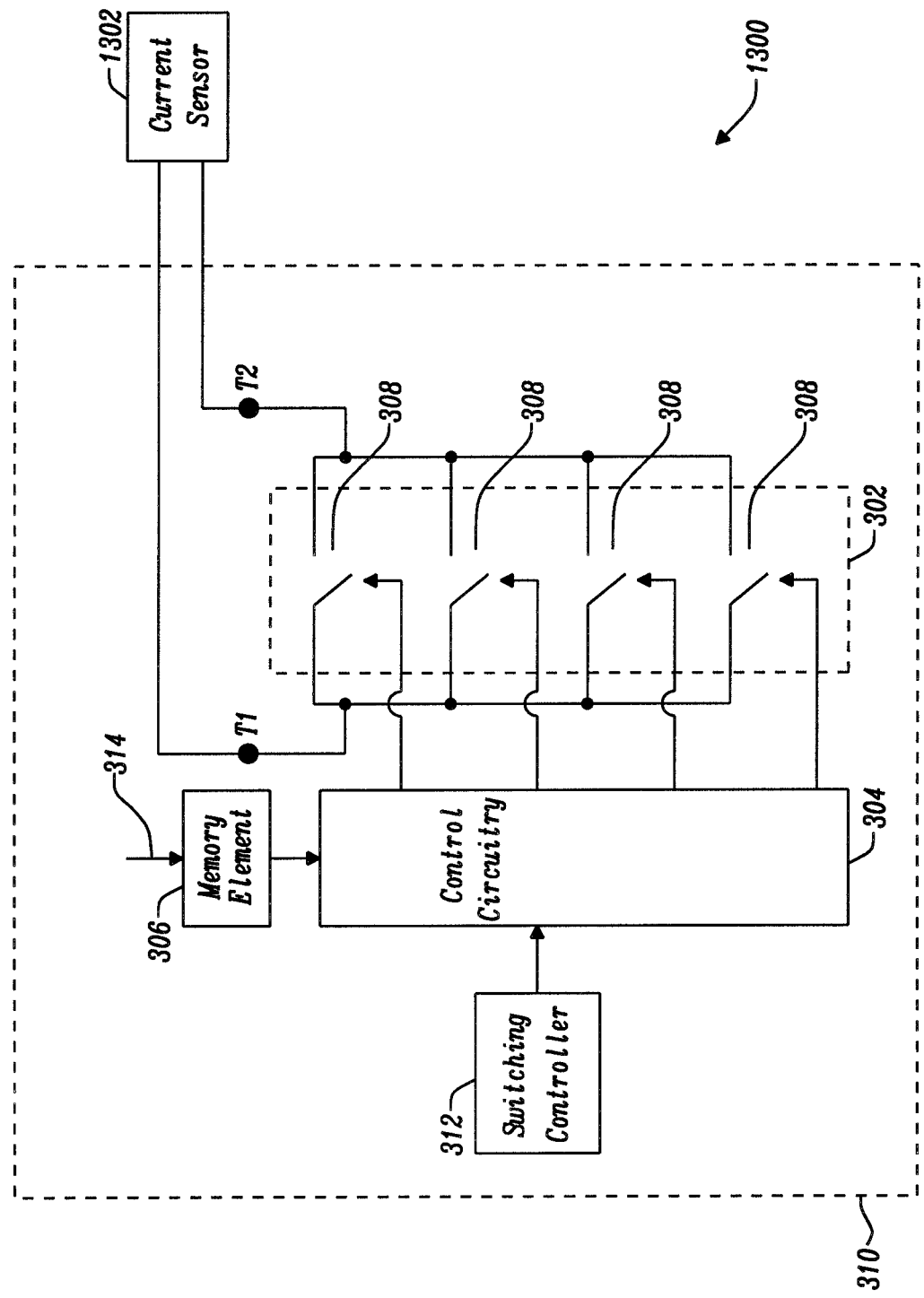
FIG. 13 is a schematic of a switching circuit in accordance with a ninth embodiment of the present disclosure.

FIG. 13 shows a schematic a switching circuit 1300 in accordance with a ninth embodiment of the present disclosure. The switching circuit 1300 comprises the switching circuit 310 and a current sensor 1302. It will be appreciated that the switching circuit 1300 may comprise any other switching circuit described herein and in accordance with the understanding of the skilled person. Common features between different Figures are represented by common reference numerals and common variables.

In operation, the current sensor 1302 measures current flowing through the switch array 302. The current sensor 1302 comprises a voltage detector that is used to measure a first voltage v1 at the first terminal T1 of the switch array 302 and a second voltage v2 at the second terminal T2 of the switch array 302. The voltages v1, v2 can then be used to determine the voltage drop ΔV. The instantaneous current flowing through the switch array 302 can be calculated using Ohm's Law with the on resistance Rdson1 of the switch array 302 and the voltage drop ΔV.

Using the calibration methods and the switching circuit disclosed herein, the switch array 302 can have a known precision Rdson1 when in an on state. An on resistance Rdson1 having a defined level of accuracy can be provided irrespective of one or more of voltage variations, temperature variations and processing/manufacturing variations. For a practical implementation of the switch array there may be a 1% variation in the on resistance Rdson1 for varying voltages, temperatures and process/manufacturing variations.

Figures 2A, 2B:
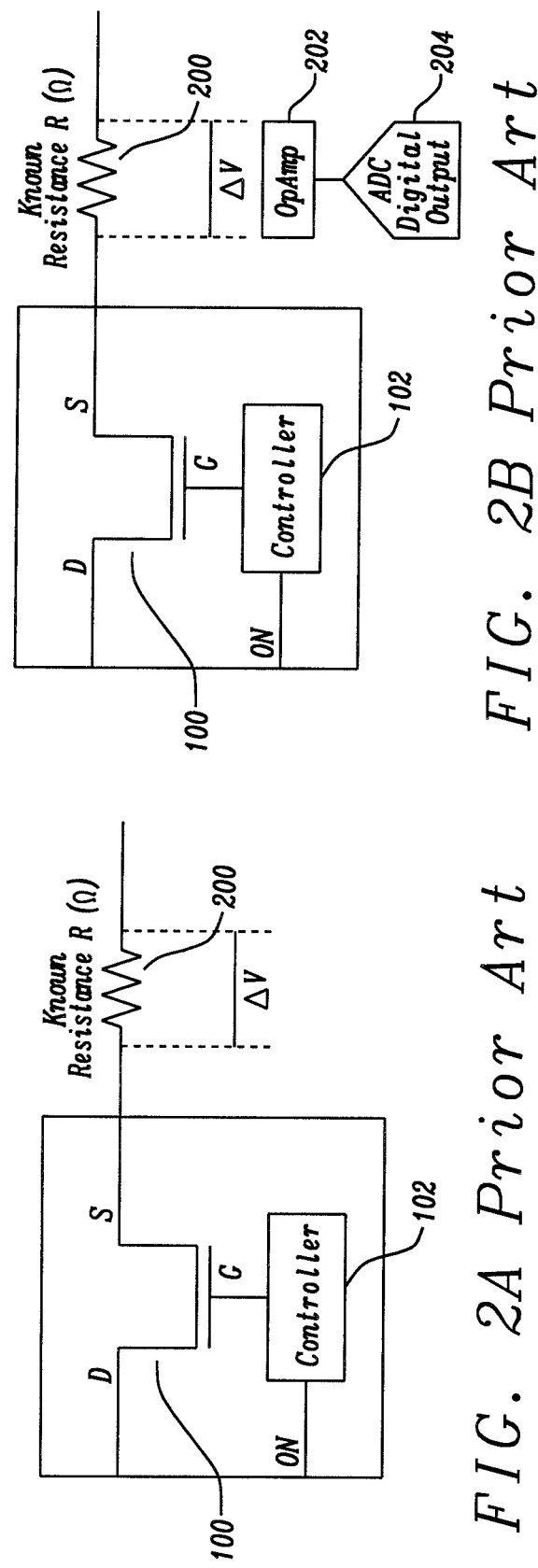
FIG. 2A is a schematic of the transistor of FIG. 1 coupled with a sense resistor and FIG. 2B is a schematic of the transistor of FIG. 1 the sense resistor, an operational amplifier and an analog to digital converter.

This enables a system engineer to have a power switching function provided by the switch array 302 that can also be used as a sense resistor, thereby eliminating the cost, efficiency drawbacks and excess heat penalties for having a separate sense resistor for use in the current measurement system as shown in FIGS. 2(a) and (b).

Figure 14:
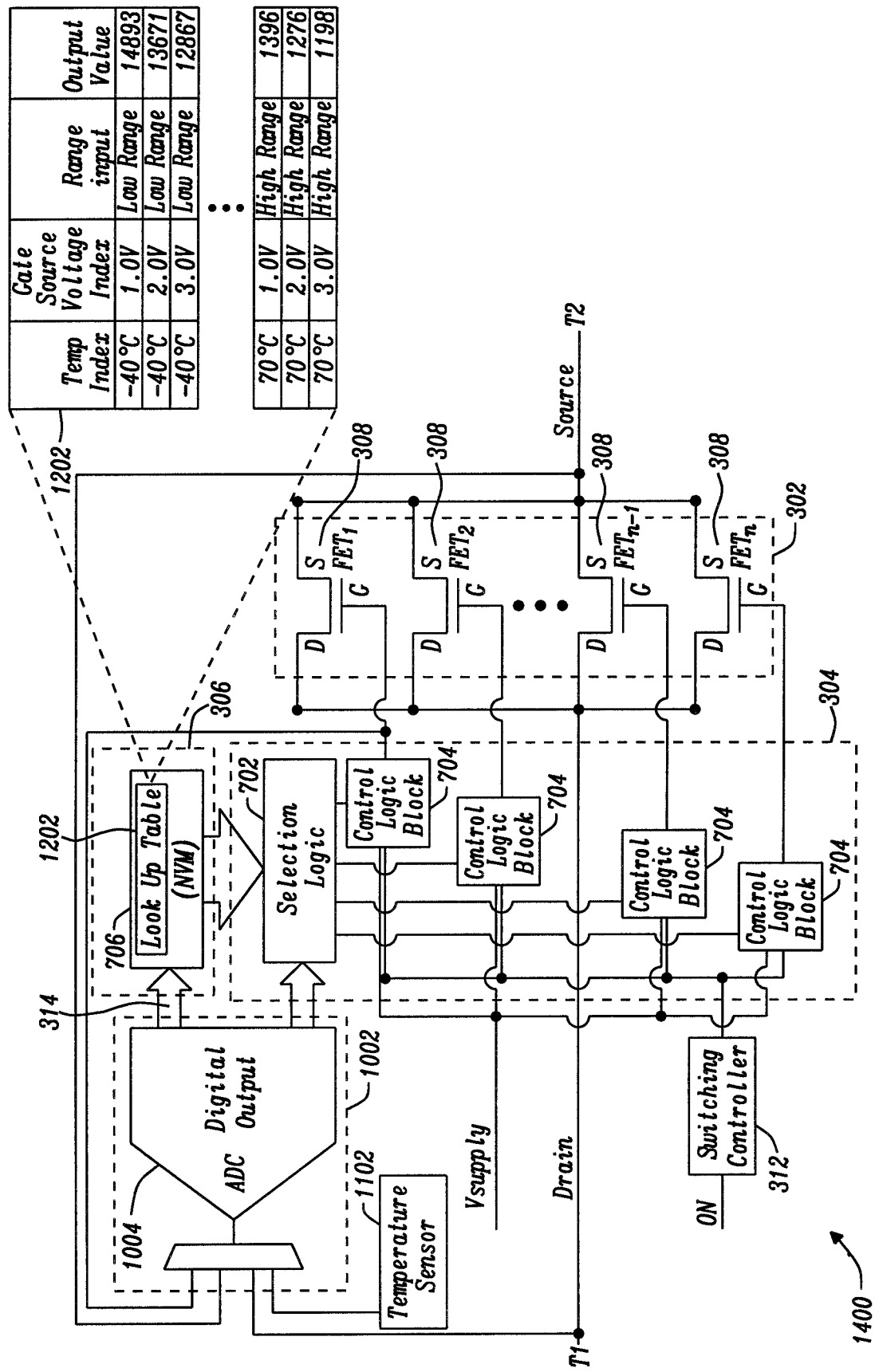
FIG. 14 is a schematic of a switching circuit in accordance with a tenth embodiment of the present disclosure.

FIG. 14 is a schematic of a switching circuit 1400 in accordance with a tenth embodiment of the present disclosure. The switching circuit 1400 corresponds to the switching circuit 1200, however the switching circuit 1400 comprises additional functionality where the on state resistance may be adjusted based on the current flowing through the switch array. Common features between different Figures are represented by common reference numerals and common variables.

The LUT 1202 further comprises configuration values relating to a current range input to enable the on resistance Rdson1 to be selected based on the current flowing through the switch array 302.

If the current flowing through the switch array 302 is small, such that complex or costly circuitry would typically be required for measurement, increasing the on resistance Rdson1 results in an increase in the voltage drop ΔV which makes it easier to measure the current. As an example, if the on resistance Rdson1 was increased by ten times, the voltage drop ΔV from drain (at the terminal T1) to source (at the terminal T2) would increase by ten times, making it easier to measure the voltage drop ΔV, and therefore to measure the current flowing in the switch array 302.

Figure 15:
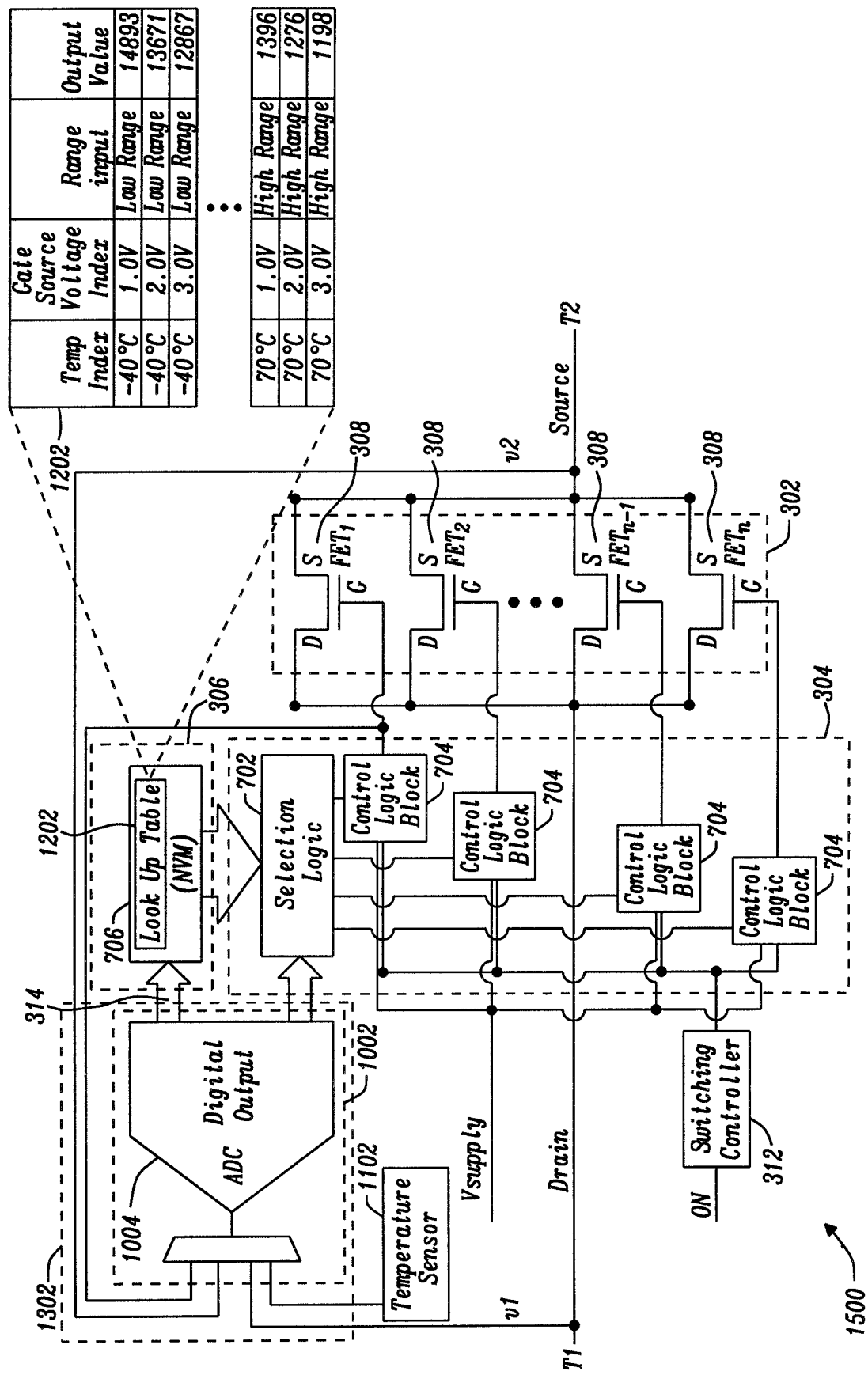
FIG. 15 is a schematic of a switching circuit in accordance with an eleventh embodiment of the present disclosure.

FIG. 15 is a schematic of a switching circuit 1500 in accordance with an eleventh embodiment of the present disclosure. The switching circuit 1500 corresponds to the switching circuit 1400, however the switching circuit 1500 comprises additional functionality where the direction of the current flowing through the switch array 302 may be measured. Common features between different Figures are represented by common reference numerals and common variables.

The switching circuit 1500 comprises the current sensor 1302 which comprises the voltage detector 1002. In the switching circuit 1500, the voltage detector 1002 is coupled to the drain (the terminal T1) and the source (the terminal T2 of the switch array) and therefore may be used to sense the current flowing through the switch array 302.

As described for the switching circuit 1300, the current sensor 1302 comprises a voltage detector (in this specific embodiment the voltage detector 1002 comprising the ADC 1004) that is used to measure a first voltage v1 at the first terminal T1 of the switch array 302 and a second voltage v2 at the second terminal T2 of the switch array 302.

The ADC 1004 may output the measured voltages v1, v2 so that an external processor 1502 can calculate the instantaneous current, in accordance with Ohm's law as described previously. This can eliminate the requirement for an external ADC to make the measurements of the voltages v1, v2 that are needed to determine the instantaneous current.

In operation, the current sensor 1302 can determine the direction of the current flowing through the switch array 302 by evaluating which is the greatest of the first voltage v1 and the second voltage v2. The current sensor 1302 may provide a signal indicative of the direction of the current flowing through the switch array 302 as the input 312 of the memory element 306 for selection of the configuration value.

In this specific embodiment the ADC 1004 can detect when the source voltage (at the terminal T2 and corresponding to the second voltage v2) is greater than the drain voltage (at the terminal T1 and corresponding to the first voltage v1). When the second voltage v2 is greater than the first voltage v1, the current through the switch array 302 is in the reverse direction. A set of configuration values relating to current direction may be included in the LUT 1202 to provide a means to adjust the on resistance Rdson1 when the current through the switch array 302 is in the reverse direction.

The on resistance Rdson1 of the switch array 302 will have a different value depending on the direction of current flowing through the switch array 302. Therefore, by measuring the current direction it is possible to further improve the accuracy of the on resistance Rdson1 provided by the switch array.

Various improvements and modifications may be made to the above without departing from the scope of the disclosure.

What is claimed is:

1. A switching circuit for providing a switch array having an on resistance, comprising:
   the switch array comprising a plurality of switches, wherein each switch is arranged to be in one of a plurality of configuration states, the configuration states comprising an enabled configuration and a disabled configuration, wherein:
   a) each switch is arranged to operate in one of a plurality of switching states when in the enabled configuration, the switching states comprising an on state and an off state; and
   b) each switch is held in the off state when in the disabled configuration;
   control circuitry configured to set each of the switches to either the enabled configuration or the disabled configuration; and
   a memory element coupled to the control circuitry and arranged to store configuration data for setting the configuration state of each of the switches; wherein:
   the control circuitry is configured to set the configuration state of each of the switches based on a configuration signal received from the memory element, the configuration signal being dependent on the configuration data; and
   the on resistance of the switch array is dependent on the switching state of the switches and their individual on resistances,
   wherein:
   the control circuitry comprises a plurality of control logic blocks, wherein each control logic block is associated with at least one switch; and
   each control logic block is configured to set its associated switch or switches to either the enabled or disabled configuration.

2. The switching circuit of claim 1, wherein the control circuitry is configured to receive a switching state signal from a switching controller and to control the switching state of the switches that are in the enabled configuration in response to the switching state signal.

3. The switching circuit of claim 1, wherein the switches of the switch array are coupled in parallel.

4. The switching circuit of claim 1, wherein each switch comprises a MOSFET.

5. The switching circuit of claim 1, wherein the configuration data comprises a plurality of configuration values and the configuration signal is dependent on at least one of the configuration values.

6. The switching circuit of claim 5, wherein the memory element is configured to receive an input, the configuration value that the configuration signal is dependent on is selected based on the input.

7. The switching circuit of claim 6, wherein the input is provided via a user interface configured to enable a user to select the configuration value.

8. The switching circuit of claim 6 comprising:
   a reference MOSFET;
   a current source configured to provide a drain/source current to the reference MOSFET; and
   a voltage detector arranged to measure a drain/source voltage of the reference MOSFET and to provide a signal indicative of the measured drain/source voltage as the input of the memory element for selection of the configuration value.

9. The switching circuit of claim 1, comprising a current sensor for measuring a current flowing through the switch array, the current sensor comprising a voltage detector arranged to measure a first voltage at a first terminal of the switch array and a second voltage at a second terminal of the switch array, the current flowing through the switch array being calculated using the measured voltages.

10. The switching circuit of claim 9, wherein the current sensor is configured to determine the direction of the current flow by evaluating which is the greatest of the first voltage and the second voltage.

11. The switching circuit of claim 6, comprising a current sensor for measuring a current flowing through the switch array, the current sensor comprising a voltage detector arranged to measure a first voltage at a first terminal of the switch array and a second voltage at a second terminal of the switch array, the current flowing through the switch array being calculated using the measured voltages.

12. The switching circuit of claim 11, wherein the current sensor is configured to determine the direction of the current flow by evaluating which is the greatest of the first voltage and the second voltage.

13. The switching circuit of claim 12, wherein the current sensor is arranged to provide a signal indicative of the direction of the current flowing through the switch array as the input of the memory element for selection of the configuration value.

14. The switching circuit of claim 1, wherein the control logic blocks are configured to receive a switching state signal from a switching controller and to control the switching state of their associated switch or switches that are in the enabled configuration in response to the switching state signal.

15. The switching circuit of claim 6, wherein the switches of the switch array are coupled in parallel and each switch comprises a MOSFET, the switching circuit comprising:

a voltage detector configured to measure the gate voltage of one of the MOSFETs and the source voltage of the parallel combination of MOSFETs; and
to provide a signal indicative of the measured gate/source voltage as the input of the memory element for selection of the configuration value.

16. The switching circuit of claim 6, comprising:
a temperature sensor configured to measure a temperature and to provide a signal indicative of the measured temperature as the input of the memory element for selection of the configuration value.

17. The switching circuit of claim 4, comprising:
a voltage detector configured to measure the drain or source voltage of a parallel combination of the MOSFETs and to adjust the gate voltage of at least one of the MOSFETs in response to the measured drain or source voltage.

18. The switching circuit of claim 17, wherein:
the memory element is configured to store gate voltage data comprising a plurality of gate voltage values for setting the gate voltage of at least one of the MOSFETs;
the voltage detector is arranged to provide a signal indicative of the measured drain or source voltage as an input of the memory element for selection of a gate voltage value; and
the control circuitry is configured to set the gate voltage of at least one of the MOSFETs based on a gate voltage signal received from the memory element, the gate voltage signal being dependent on the selected gate voltage value.

19. The switching circuit of claim 1, wherein each switch comprises one or more sub-switches.

20. The switching circuit of claim 18, wherein the implementation of sub-switches uses a binary weighting scheme.

21. The switching circuit of claim 1, wherein the memory element comprises non-volatile memory for storing the configuration data.

22. A method of generating configuration data for a switching circuit comprising:
a switch array having an on resistance and comprising a plurality of switches, wherein each switch is arranged to be in one of a plurality of configuration states, the configuration states comprising an enabled configuration and a disabled configuration; and
a memory element coupled to the control circuitry and arranged to store configuration data for setting the configuration state of each of the switches, the method comprising:
passing a reference current through the switch array;
measuring the on resistance of the switch array;
adjusting the number of switches in an on state until a target on resistance is measured; and
storing calibration data relating to the switches that are in the on state as at least a portion of the configuration data, when the target on resistance is measured,
wherein:
the control circuitry comprises a plurality of control logic blocks, wherein each control logic block is associated with at least one switch; and
each control logic block is configured to set its associated switch or switches to either the enabled or disabled configuration.

23. The method of claim 22, comprising:
repeating for a range of gate/source voltages of the switch array:
a) passing a reference current through the switch array,
b) measuring the on resistance of the switch array, and
c) adjusting the number of switches in an on state until a target on resistance is measured; and
storing calibration data relating to the switches that are in the on state as a different configuration value for each of the gate/source voltages.

24. The method of claim 22, comprising:
repeating for a range of temperatures of the switch array:
a) passing a reference current through the switch array,
b) measuring the on resistance of the switch array, and
c) adjusting the number of switches in an on state until a target on resistance is measured; and
storing calibration data relating to the switches that are in the on state as a different configuration value for each of the temperatures.

25. A method of providing a switch array having an on resistance, the switch array comprising a plurality of switches, wherein each switch is arranged to be in one of a plurality of configuration states, the configuration states comprising an enabled configuration and a disabled configuration, wherein:
a) each switch is arranged to operate in one of a plurality of switching states when in the enabled configuration, the switching states comprising an on state and an off state; and
b) each switch is held in the off state when in the disabled configuration; wherein:
the on resistance of the switch array is dependent on the switching state of the switches and their individual on resistances, the method comprising:
storing configuration data for setting the configuration state of each of the switches using a memory element coupled to control circuitry;
receiving a configuration signal at the control circuitry from the memory element, the configuration signal being dependent on the configuration data; and
setting the configuration state of each of the switches using control circuitry, the configuration state being based on the configuration signal,
wherein:
the control circuitry comprises a plurality of control logic blocks, wherein each control logic block is associated with at least one switch; and
each control logic block is configured to set its associated switch or switches to either the enabled or disabled configuration.

26. A switching circuit for providing a switch array having an on resistance, comprising:
the switch array comprising a plurality of switches, wherein each switch is arranged to operate in one of a plurality of switching states, the switching states comprising an on state and an off state;
control circuitry configured to set a control voltage of at least one of the switches; and
a memory element coupled to the control circuitry and configured to store control voltage data comprising a plurality of control voltage values for setting the control voltage of at least one of the switches; wherein:
the control circuitry is configured to set the control voltage of at least one of the switches based on a control voltage signal received from the memory element, the control voltage signal being dependent on the control voltage data; and
the on resistance of the switch array is dependent on the switching state of the switches and their individual on resistances, wherein:

the control circuitry comprises a plurality of control logic blocks, wherein each control logic block is associated with at least one switch; and each control logic block is configured to adjust the control voltage of its associated switch or switches.

27. The switching circuit of claim 26, wherein:

each switch comprises a MOSFET;

the control voltage is a gate voltage;

the control voltage data is gate voltage data;

the control voltage values are gate voltage values; and the control voltage signal is a gate voltage signal; the switching circuit comprising:

a voltage detector configured to measure the drain or source voltage of a parallel combination of the MOSFETs and to provide a signal indicative of the measured drain or source voltage as an input of the memory element for selection of a gate voltage value;

wherein:

the control circuitry is configured to set the gate voltage of at least one of the MOSFETs based on a gate voltage signal received from the memory element, the gate voltage signal being dependent on the selected gate voltage value.

28. A method of providing a switching circuit for providing a switch array having an on resistance, the switch array comprising a plurality of switches, wherein each switch is arranged to operate in one of a plurality of switching states, the switching states comprising an on state and an off state, the method comprising:

storing control voltage data comprising a plurality of control voltage values for setting the control voltage of at least one of the switches using a memory element;

setting the control voltage of at least one of the switches using control circuitry, based on a control voltage signal received at the control circuitry from the memory element, the control voltage signal being dependent on the control voltage data; wherein:

the on resistance of the switch array is dependent on the switching state of the switches and their individual on resistances, wherein:

the control circuitry comprises a plurality of control logic blocks, wherein each control logic block is associated with at least one switch; and each control logic block is configured to adjust the control voltage of its associated switch or switches.

\* \* \* \* \*